「United States Patent」 Kim et al.

(10) Patent No.: US 11,626,574 B2
(45) Date of Patent: Apr. 11, 2023

(54) ORGANIC LIGHT-EMITTING DISPLAY APPARATUS AND METHOD OF MANUFACTURING THE SAME

(71) Applicant: Samsung Display Co., Ltd., Yongin-si (KR)

(72) Inventors: Jaesik Kim, Yongin-si (KR); Jaeik Kim, Yongin-si (KR); Yeonhwa Lee, Yongin-si (KR); Joongu Lee, Yongin-si (KR); Sehoon Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 110 days.

(21) Appl. No.: 16/847,349

(22) Filed: Apr. 13, 2020

(65) Prior Publication Data

US 2020/0328378 A1  Oct. 15, 2020

(30) Foreign Application Priority Data

Apr. 15, 2019  (KR) ......................... 10-2019-0043783

(51) Int. Cl.
  *H01L 51/52* (2006.01)
  *H01L 27/32* (2006.01)
  *H01L 51/56* (2006.01)

(52) U.S. Cl.
  CPC ...... *H01L 51/5253* (2013.01); *H01L 27/3246* (2013.01); *H01L 51/56* (2013.01); *H01L 2251/305* (2013.01)

(58) Field of Classification Search
  None
  See application file for complete search history.

(56) References Cited

U.S. PATENT DOCUMENTS 9,153,797 B2  10/2015 Kim et al.
10,020,351 B2   7/2018 Yang et al.
(Continued)

FOREIGN PATENT DOCUMENTS

JP          2008-34198 A   2/2008
KR   10-2014-0082089 A   7/2014
(Continued)

*Primary Examiner* — Kenneth Parker
*Assistant Examiner* — Christopher A Culbert
(74) *Attorney, Agent, or Firm* — Lewis Roca Rothgerber Christie LLP

(57) ABSTRACT

An organic light-emitting display apparatus includes: a substrate; first and second pixel electrodes on the substrate and spaced from each other; an insulating layer between the first and second pixel electrodes, the insulating layer covering ends of the first and second pixel electrodes, and having a step height difference; an auxiliary electrode on the insulating layer; first and second intermediate layers on the first and second pixel electrodes, the first and second intermediate layers being spaced from each other, and including first and second light-emitting layers, respectively; first and second opposite electrodes on the first and second intermediate layers, the first and second opposite electrodes being spaced from each other, and in contact with the auxiliary electrode; and first and second passivation layers on the first and second opposite electrodes, the first and second passivation layers being spaced from each other, and covering the first and second opposite electrodes, respectively.

10 Claims, 18 Drawing Sheets

(56) References Cited

U.S. PATENT DOCUMENTS

| | | | |
|---|---|---|---|
| 10,205,124 B2 | 2/2019 | Park et al. | |
| 2009/0009069 A1* | 1/2009 | Takata | H01L 27/3246 |
| | | | 313/504 |
| 2010/0289019 A1 | 11/2010 | Katz et al. | |
| 2013/0037835 A1* | 2/2013 | Lee | H01L 27/3279 |
| | | | 257/91 |
| 2013/0153915 A1* | 6/2013 | Choi | H01L 27/3211 |
| | | | 257/72 |
| 2017/0358633 A1* | 12/2017 | Park | H01L 51/5228 |
| 2017/0365812 A1* | 12/2017 | Choung | H01L 51/5092 |
| 2018/0033968 A1 | 2/2018 | Lee et al. | |

FOREIGN PATENT DOCUMENTS

| | | | | |
|---|---|---|---|---|
| KR | 10-2016-0053343 A | | 5/2016 | |
| KR | 20160053343 A | * | 5/2016 | |
| KR | 10-2017-0140486 A | | 12/2017 | |
| KR | 10-2018-0000975 A | | 1/2018 | |
| KR | 10-2018-0014895 A | | 2/2018 | |

* cited by examiner

ORGANIC LIGHT-EMITTING DISPLAY APPARATUS AND METHOD OF MANUFACTURING THE SAME

CROSS-REFERENCE TO RELATED APPLICATION

This application claims priority to and the benefit of Korean Patent Application No. 10-2019-0043783, filed on Apr. 15, 2019, in the Korean Intellectual Property Office, the disclosure of which is incorporated herein in its entirety by reference.

BACKGROUND

1. Field

One or more embodiments relate to an organic light-emitting display apparatus and a method of manufacturing the same, and more particularly, to an organic light-emitting display apparatus and a method of manufacturing the organic light-emitting display apparatus having fewer defects and a simplified manufacturing process.

2. Description of the Related Art

An organic light-emitting display apparatus includes an organic light-emitting diode including a hole injection electrode, an electron injection electrode, and an organic emissive layer arranged therebetween. The organic light-emitting display apparatus is a self-emissive display apparatus that emits light when excitons drop from an excitation state to a ground state. The excitons are generated when holes injected from the hole injection electrode are combined with electrons injected from the electron injection electrode in the organic emissive layer.

A fine metal mask (FMM) may be used as technology for depositing the organic emissive layer on a substrate. However, due to a shadow effect of a metal mask, there may be a limit in manufacturing an organic light-emitting display apparatus with high resolution. Thus, alternative deposition technologies may be desired.

The above information disclosed in this Background section is for enhancement of understanding of the background of the present disclosure, and therefore, it may contain information that does not constitute prior art.

SUMMARY

One or more embodiments are directed to an organic light-emitting display apparatus and a method of manufacturing the organic light-emitting display apparatus, which may have fewer defects, and the manufacturing process of the organic light-emitting display apparatus may be simplified. However, the one or more embodiments provided herein are example embodiments, and the spirit and scope of the present disclosure is not limited thereto.

According to one or more embodiments, an organic light-emitting display apparatus includes: a substrate; first and second pixel electrodes on the substrate and spaced from each other; an insulating layer between the first and second pixel electrodes, the insulating layer covering ends of the first and second pixel electrodes and having a step height difference; an auxiliary electrode on the insulating layer; first and second intermediate layers on the first and second pixel electrodes, respectively, the first and second intermediate layers being spaced from each other, and comprising first and second light-emitting layers, respectively; first and second opposite electrodes on the first and second intermediate layers, respectively, the first and second opposite electrodes being spaced from each other, and in contact with the auxiliary electrode; and first and second passivation layers on the first and second opposite electrodes, respectively, the first and second passivation layers being spaced from each other, and covering the first and second opposite electrodes, respectively.

In an embodiment, the auxiliary electrode may have a closed loop shape that surrounds peripheries of the first and second pixel electrodes.

In an embodiment, the insulating layer may have a closed loop shape that surrounds peripheries of the first and second pixel electrodes.

In an embodiment, the insulating layer may include: a first layer including an organic insulating material; and a second layer covering the first layer, the second layer including an inorganic insulating material.

In an embodiment, the insulating layer may include: a first layer including an inorganic insulating material; a second layer on the first layer, the second layer including an organic insulating material; and a third layer on the second layer, the third layer including an inorganic insulating layer.

In an embodiment, ends of the first and second opposite electrodes may be in contact with an upper surface of the auxiliary electrode.

In an embodiment, each of the first and second passivation layers may include at least one selected from among an oxide, a nitride, and an oxynitride.

In an embodiment, the organic light-emitting display apparatus may further include: an encapsulation member sequentially arranged on the first passivation layer and the second passivation layer, the encapsulation member including at least one organic layer and at least one inorganic layer.

In an embodiment, the organic light-emitting display apparatus may further include: a first connection layer between the first opposite electrode and the first passivation layer; and a second connection layer between the second opposite electrode and the second passivation layer.

In an embodiment, each of the first and second connection layers may include a transparent conductive oxide.

According to one or more embodiments, a method of manufacturing an organic light-emitting display apparatus, includes: forming a first pixel electrode and a second pixel electrode on a substrate, the first and second pixel electrodes being spaced from each other; forming an insulating layer to cover ends of the first and second pixel electrodes, the insulating layer having a step height difference; forming an auxiliary electrode on the insulating layer; sequentially forming a first lift-off layer and a first photoresist on the first and second pixel electrodes, the insulating layer, and the auxiliary electrode; forming a first opening that exposes an upper surface of the first pixel electrode, an upper surface of the insulating layer, and an upper surface of the auxiliary electrode, by patterning the first lift-off layer and the first photoresist; sequentially forming a first intermediate layer and a first opposite electrode on both the first opening and the first photoresist, the first intermediate layer including a first light-emitting layer; forming a first passivation layer to cover an upper surface of the first opposite electrode and ends of the first opposite electrode; and removing each of the first lift-off layer and the first photoresist.

In an embodiment, the first intermediate layer may be formed by using a first deposition process, the first opposite electrode may be formed by using a second deposition process, and the first passivation layer may be formed by using a third deposition process that provides a step coverage that may be greater than step coverages of the first intermediate layer and the first opposite electrode.

In an embodiment, a physical vapor deposition process may be used in the first deposition process and the second deposition process.

In an embodiment, a chemical vapor deposition process or an atomic layer deposition process may be used in the third deposition process.

In an embodiment, a portion of the first passivation layer that is on the auxiliary electrode may be removed by performing dry etching after the third deposition process is performed.

In an embodiment, at the first opening, an end of the first photoresist may extend further towards a central area of the first opening than an end of the first lift-off layer, and during a process of forming the first passivation layer, an area of the end of the first photoresist may sag toward the substrate to form an overhang structure.

In an embodiment, the method may further include: forming a first connection layer between the first opposite electrode and the first passivation layer.

In an embodiment, the method may further include: sequentially forming a second lift-off layer and a second photoresist on the second pixel electrode, the insulating layer, and the auxiliary electrode, after removing each of the first lift-off layer and the first photoresist; forming a second opening that exposes an upper surface of the second pixel electrode, an upper surface of the insulating layer, and an upper surface of the auxiliary electrode, by patterning the second lift-off layer and the second photoresist; sequentially forming a second intermediate layer and a second opposite electrode on both the second opening and the second photoresist, the second intermediate layer including a second light-emitting layer; forming a second passivation layer to cover an upper surface of the second opposite electrode and ends of the second opposite electrode; and removing each of the second lift-off layer and the second photoresist.

In an embodiment, a color of light that is emitted from the first light-emitting layer may be different from a color of light that is emitted from the second light-emitting layer.

In an embodiment, the method may further include: forming an encapsulation member on the first passivation layer and the second passivation layer, the encapsulation member including at least one organic layer and at least one inorganic layer.

BRIEF DESCRIPTION OF THE DRAWINGS

The above and/or other aspects and features will become more apparent to those skilled in the art from the following detailed description of the example embodiments with reference to the accompanying drawings, in which.

DETAILED DESCRIPTION

Figure 1:
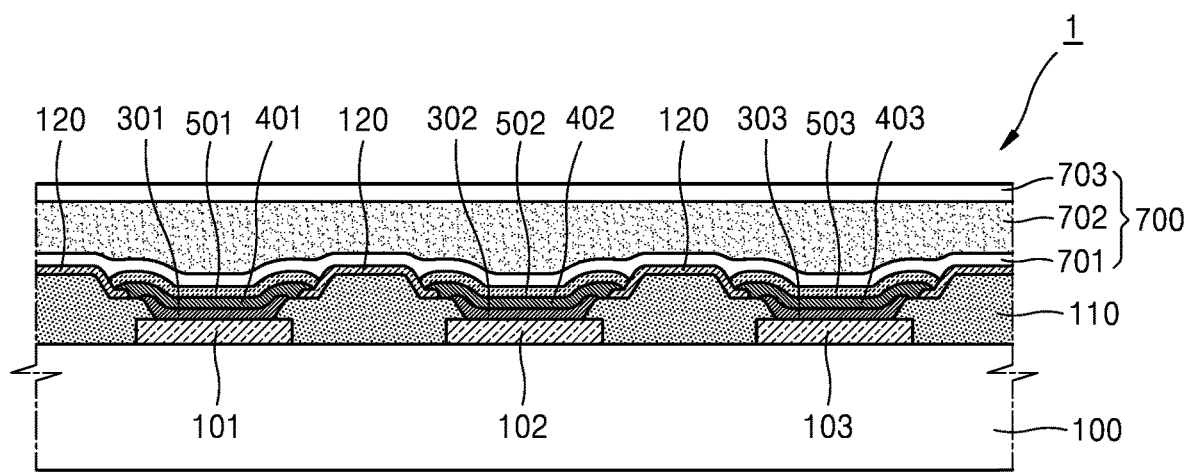
FIG. 1 is a schematic cross-sectional view of an organic light-emitting display apparatus according to an embodiment.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively.

When an example embodiment may be implemented differently, a specific process order described herein may be performed differently from the described order. For example, two consecutively described processes may be performed concurrently (e.g., simultaneously or substantially at the same time) or may be performed in an order opposite to the described order.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
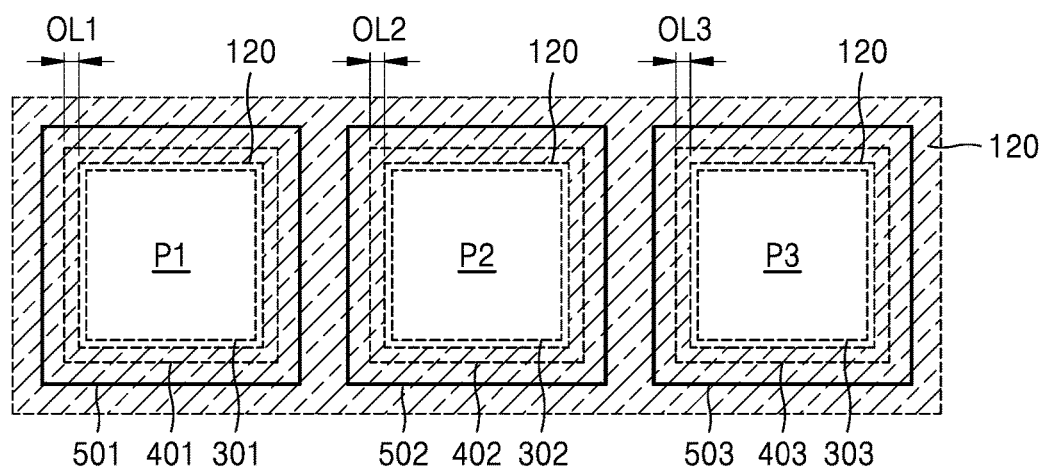
FIG. 2 is a plan view of a portion of the organic light-emitting display apparatus of FIG. 1.

FIG. 1 is a schematic cross-sectional view of an organic light-emitting display apparatus 1 according to an embodiment. FIG. 2 is a plan view of a portion of the organic light-emitting display apparatus of FIG. 1.

Referring to FIGS. 1 and 2, in the organic light-emitting display apparatus 1 according to the present embodiment, a plurality of pixel electrodes including a first pixel electrode 101, a second pixel electrode 102, and a third pixel electrode 103 may be arranged on a substrate 100 to be spaced apart from each other.

A pixel-defining layer 110 covers ends of the plurality of first to third pixel electrodes 101, 102, and 103, and defines a light-emitting area. In some embodiments, the pixel-defining layer 110 may reduce or prevent concentration of an electric field at each end of the plurality of first to third pixel electrodes 101, 102, and 103.

An auxiliary electrode 120 is arranged on the pixel-defining layer 110 to be spaced apart from the first to third pixel electrodes 101, 102, and 103. The auxiliary electrode 120 may surround each of the first to third pixel electrodes 101, 102, and 103, and may be formed to have, for example, a closed loop shape. For example, in some embodiments, the auxiliary electrode may surround a periphery of each of the first to third pixel electrodes 101, 102, and 103 in a plan view (e.g., at a plane that is parallel or substantially parallel to a surface of the display apparatus 1).

First to third intermediate layers 301, 302, and 303 that respectively include first to third light-emitting layers are located on the first to third pixel electrodes 101, 102, and 103, respectively. First to third opposite electrodes 401, 402, and 403 are located on the first to third intermediate layers 301, 302, and 303, respectively.

The first to third pixel electrodes 101, 102, and 103, the first to third intermediate layers 301, 302, and 303, and the first to third opposite electrodes 401, 402, and 403 may each have an isolated pattern (e.g., an island pattern or an island-type pattern). The isolated pattern, island pattern or island-type pattern may be a pattern obtained by patterning a suitable area (e.g., a patterned area or a predetermined area) to have an island shape that is divided and distinguished from other areas that are adjacent to (e.g., areas that surround) the patterned area (e.g., the predetermined area).

In the present embodiment, each of the first to third opposite electrodes 401, 402, and 403 may extend to the pixel-defining layer 110 to contact an upper surface of the auxiliary electrode 120. Ends of the first to third opposite electrodes 401, 402, and 403 may overlap with ends of the auxiliary electrode 120 to form first to third overlapping areas OL1, OL2, and OL3. In other words, the first to third overlapping areas OL1, OL2, and OL3 may be defined by areas where the ends of the first to third opposite electrodes 402, 402, and 403 overlap with the ends of the auxiliary electrode 120.

In some embodiments, the auxiliary electrode 120 may be electrically connected to a common power voltage (e.g., a common voltage), and the common voltage may be applied to each of the first to third opposite electrodes 401, 402, and 403 that are connected to (e.g., in contact with) the auxiliary electrode 120. When a driving current is transmitted from a driving thin-film transistor to each of the first to third pixel electrodes 101, 102, and 103, and the common power voltage is applied to the first to third opposite electrodes 401, 402, and 402 via the auxiliary electrode 120, the first to third light-emitting layers of the first to third intermediate layers 301, 302, and 303 emit light.

Each of the first to third pixel electrodes 101, 102, and 103 and the first to third intermediate layers 301, 302, and 303 may be deposited (or formed) by using physical vapor deposition (PVD), for example.

First to third passivation layers 501, 502, and 503 may be located on the first to third opposite electrodes 401, 402, and 403, respectively. Each of the first to third passivation layers 501, 502, and 503 may have an isolated pattern (e.g., island pattern or an island-type pattern).

The first to third passivation layers 501, 502, and 503 may include a material that may be deposited by using chemical vapor deposition (CVD) or atomic layer deposition (ALD). CVD and ALD may each have improved (e.g., more excellent) step coverage than that of PVD. In an embodiment, the first to third passivation layers 501, 502, and 503 may include, for example, an oxide-based material, a nitride-based material, or an oxynitride-based material. However, the present disclosure is not limited thereto.

In some embodiments, the first to third passivation layers 501, 502, and 503, may overlap with the first to third intermediate layers 301, 302, and 303 and the first to third opposite electrodes 401, 402, and 403, respectively. For example, in some embodiments, the first to third passivation layers 501, 502, and 503 may be disposed in a process to cover (e.g., completely or entirely cover) the first to third intermediate layers 301, 302, and 303 and the first to third opposite electrodes 401, 402, and 403, respectively, to prevent or substantially prevent deterioration of the first to third intermediate layers 301, 302, and 303 and the first to third opposite electrodes 401, 402, and 403. In some embodiments, the first to third passivation layers 501, 502, and 503 may have larger sizes than those of the first to third intermediate layers 301, 302, and 303 and the first to third opposite electrodes 401, 402, and 403.

An encapsulation member 700 may be arranged on the first to third passivation layers 501, 502, and 503 and the auxiliary electrode 120. The encapsulation member 700 may include at least one organic layer and at least one inorganic layer. FIG. 1 shows a structure in which the encapsulation member 700 includes a first inorganic layer 701, an organic layer 702, and a second inorganic layer 703 that are stacked (e.g., sequentially stacked) on each other, but the present disclosure is not limited thereto.

The organic layer 702 may include, for example, polyethylene terephthalate, polyethylene naphthalate, polycarbonate, polyimide, polyethylene sulfonate, polyoxymethylene, polyarylate, hexamethyldisiloxane, acrylic-based resin (e.g., polymethyl methacrylate, polyacrylic acid, etc.), or any suitable combination thereof.

The first and second inorganic layers 701 and 703 may include, for example, aluminum nitride (AlN), aluminum oxide ($Al_2O_3$), titanium nitride (TiN), titanium dioxide ($TiO_2$), silicon oxynitride (SiON), silicon nitride ($SiN_x$), silicon oxide ($SiO_x$), and/or the like.

The encapsulation member 700 may prevent or substantially prevent penetration of moisture to prevent or reduce damage to the first to third passivation layers 501, 502, and 503 described above and an organic light-emitting diode that may be fragile to (e.g., may have deteriorated or degraded performance due to) moisture.

The first to third light-emitting layers may emit light having different colors. The first to third light-emitting layers may be included in the first to third intermediate layers 301, 302, and 303 at (e.g., in or on) first to third sub-pixels P1, P2, and P3. The first sub-pixel P1 may emit red light. The second sub-pixel may emit green light. The third sub-pixel P3 may emit blue light. However, the present disclosure is not limited thereto, and the first to third sub-pixels P1, P2, and P3 may emit white light, in addition to or in lieu of the red light, the green light, and the blue light as described above. In the present embodiment, an arrangement of three sub-pixels are illustrated in FIGS. 1 and 2. However, the present disclosure is not limited thereto.

Hereinafter, a method of manufacturing the organic light-emitting display apparatus 1 according to the present embodiment, and the organic light-emitting display apparatus 1 manufactured by performing the method are described in detail with reference to FIGS. 3 through 13.

Figure 3:
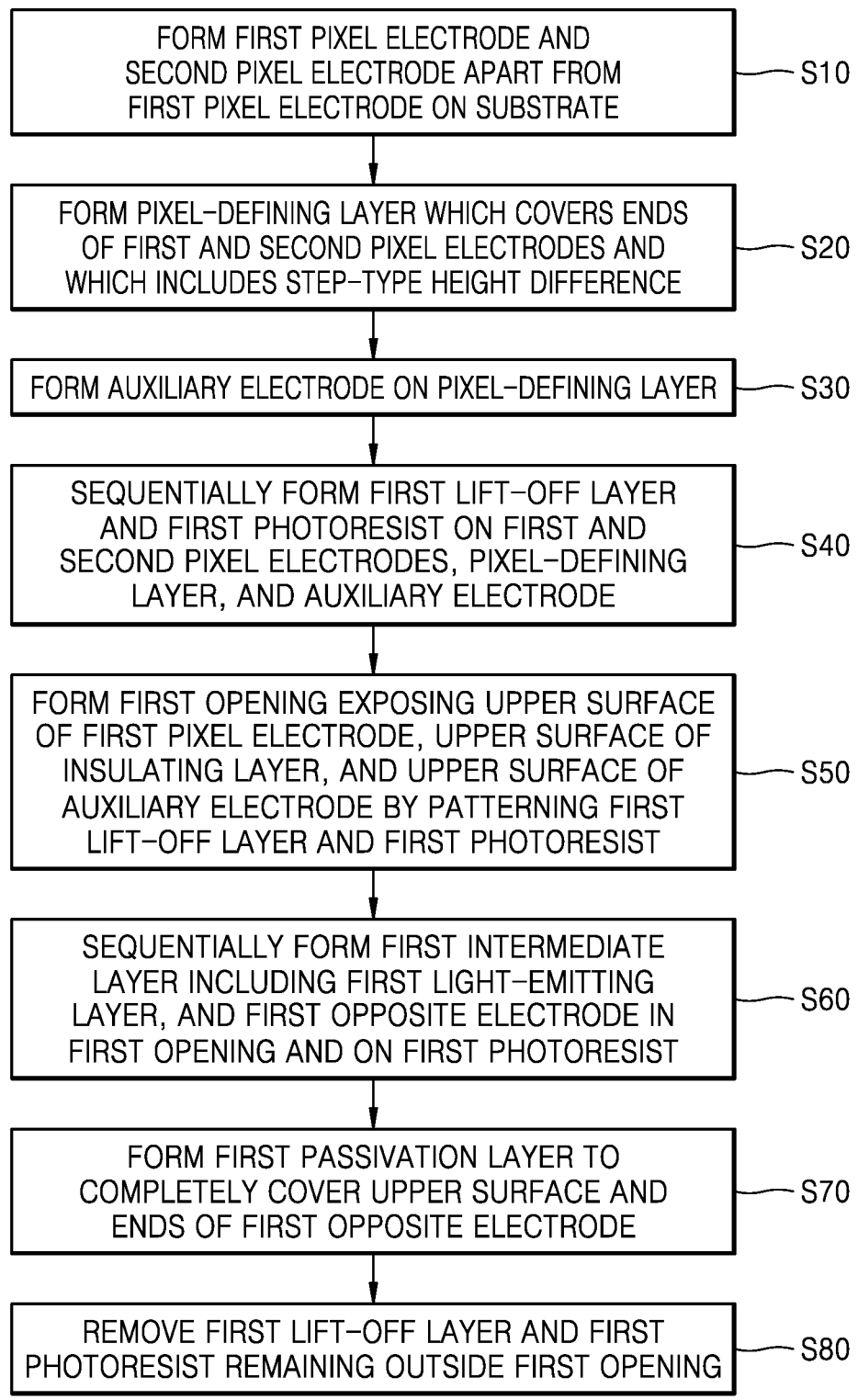
FIG. 3 is a schematic process chart of a method of manufacturing the organic light-emitting display apparatus, according to an embodiment.
Figure 4:
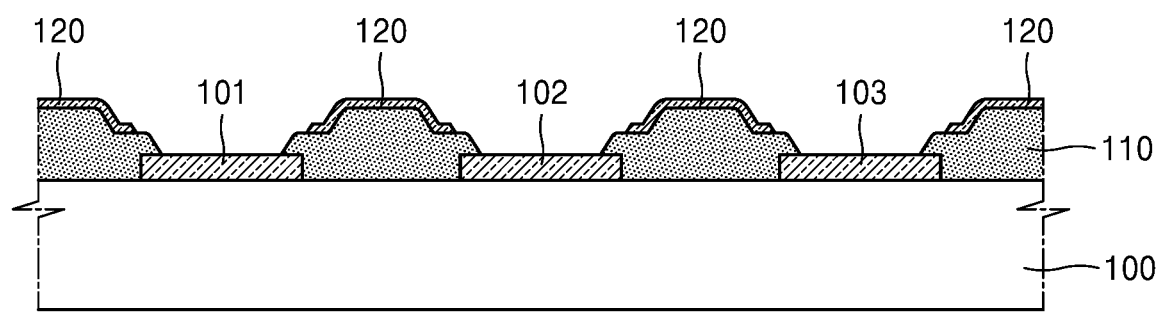
FIG. 4 is a schematic cross-sectional view illustrating operations of forming first to third pixel electrodes, a pixel-defining layer, and an auxiliary electrode on a substrate of the organic light-emitting display apparatus according to an embodiment.
Figure 5:
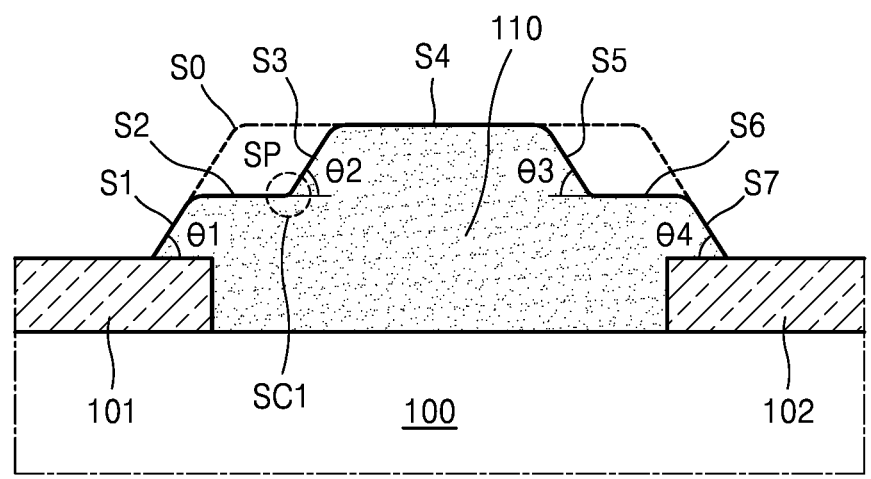
FIG. 5 is a schematic cross-sectional view of a step-type height difference in the pixel-defining layer.
Figure 6:
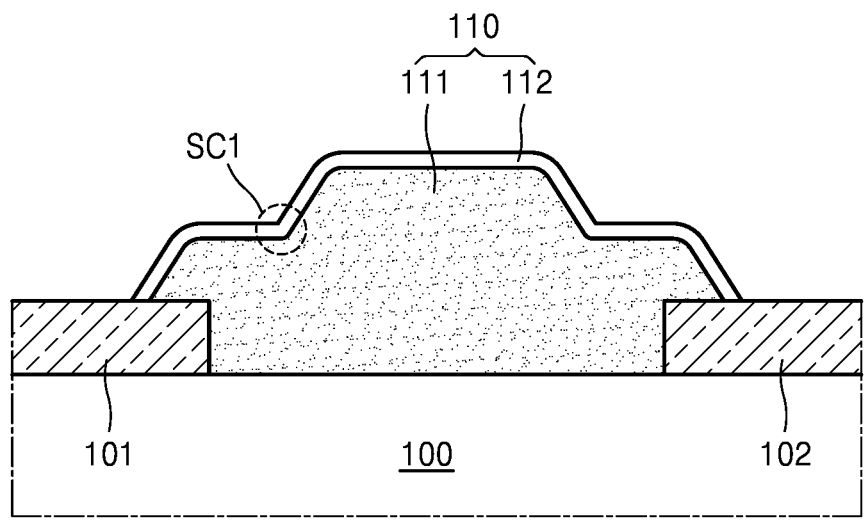
FIGS. 6-8 are schematic cross-sectional views illustrating various embodiments of the pixel-defining layer.
Figure 7:
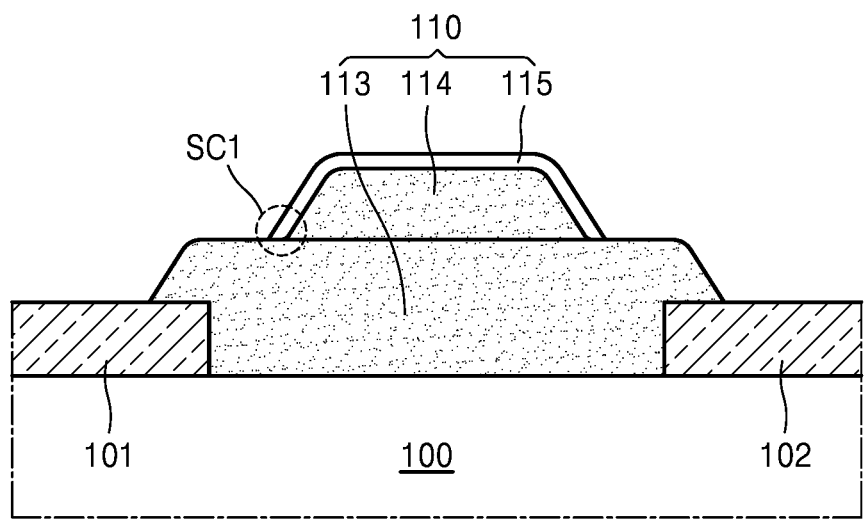
Figure 8:
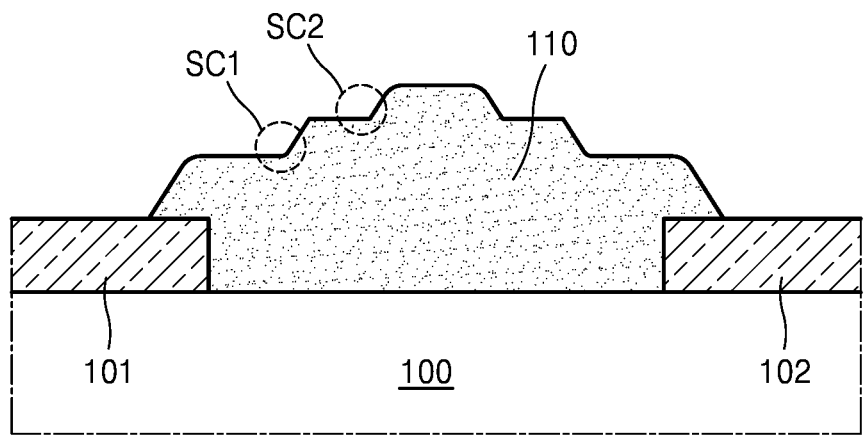
Figure 12:
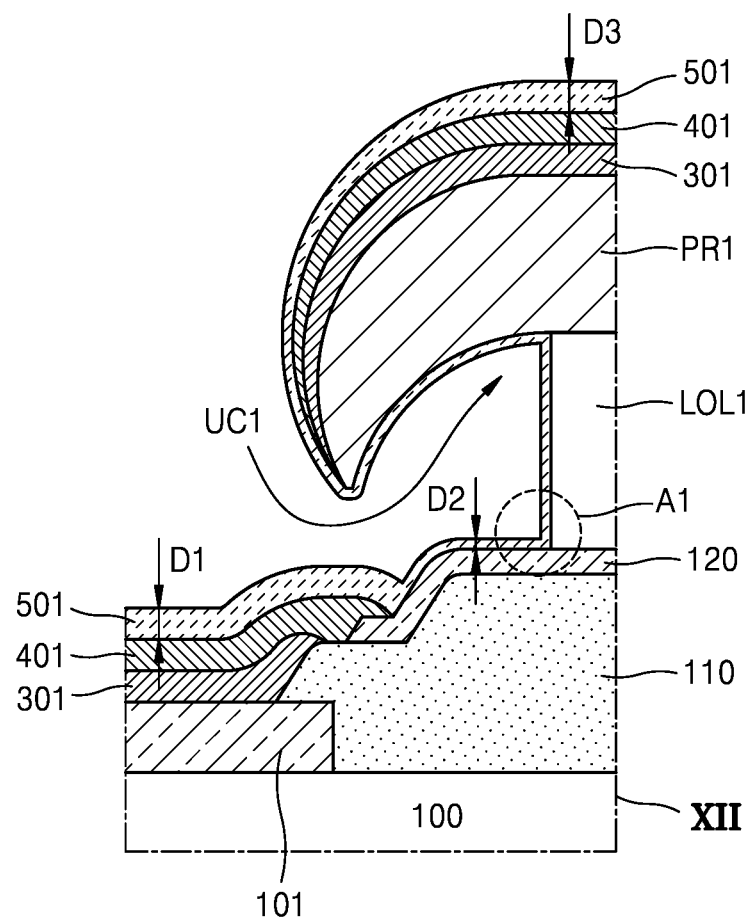
FIG. 12 is an enlarged cross-sectional view illustrating the region XII of the organic light-emitting display apparatus of FIG. 9E.
Figure 13:
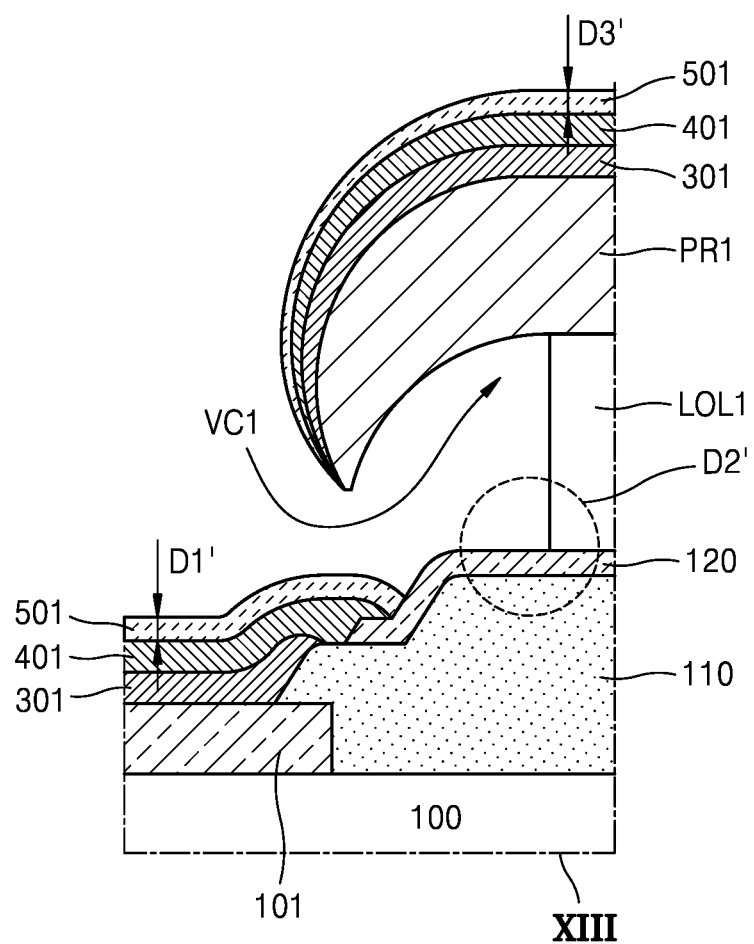
FIG. 13 is an enlarged cross-sectional view illustrating the region XIII of the organic light-emitting display apparatus of FIG. 9F.

FIG. 3 is a schematic process chart of the method of manufacturing the organic light-emitting display apparatus 1, according to an embodiment. FIG. 4 is a schematic cross-sectional view illustrating operations of forming the first to third pixel electrodes 101,102, and 103, the pixel-defining layer 110, and the auxiliary electrode 120 on the substrate 100 of the organic light-emitting display apparatus 1 according to an embodiment. FIG. 5 is a schematic cross-sectional view of a step or step-type height difference in the pixel-defining layer 110. FIGS. 6 through 8 are schematic cross-sectional views illustrating various embodiments of the pixel-defining layer 110. FIGS. 9A through 9G are schematic cross-sectional views illustrating a first unit process of the organic light-emitting display apparatus 1 according to an embodiment. FIGS. 10A through 10G are schematic cross-sectional views illustrating a second unit process of the organic light-emitting display apparatus 1 according to an embodiment. FIGS. 11A through 11G are schematic cross-sectional views illustrating a third unit process of the organic light-emitting display apparatus 1 according to an embodiment. FIG. 12 is an enlarged cross-sectional view illustrating the region XII of the organic light-emitting display apparatus of FIG. 9E. FIG. 13 is an enlarged cross-sectional view illustrating the region XIII of the organic light-emitting display apparatus of FIG. 9F.

Referring to FIG. 3, the method of manufacturing the organic light-emitting display apparatus 1, according to an embodiment, includes forming on a substrate, a first pixel electrode and a second pixel electrode spaced apart from the first pixel electrode at block S10. The method includes forming a pixel-defining layer that covers ends of the first and second pixel electrodes and includes a step or step-type height difference at block S20. The method includes forming an auxiliary electrode on the pixel-defining layer at block S30. The method includes forming (e.g., sequentially forming) a first lift-off layer and a first photoresist on the first and second pixel electrodes, the pixel-defining layer, and the auxiliary electrode at block S40. The method includes forming a first opening that exposes an upper surface of the first pixel electrode, an upper surface of the pixel-defining layer, and an upper surface of the auxiliary electrode by patterning the first lift-off layer and the first photoresist at block S50. The method includes forming (e.g., sequentially forming) a first intermediate layer including a first light-emitting layer, and a first opposite electrode at (e.g., in or on) the first opening and on the first photoresist at block S60. The method includes forming a first passivation layer to cover (e.g., entirely or completely cover) an upper surface and ends of the first opposite electrode at block S70. The method includes removing the first lift-off layer and the first photoresist that remain outside of the first opening at block S80. Hereinafter, the method of manufacturing the organic light-emitting display apparatus 1, according to an embodiment, is described in more detail with reference to FIGS. 4 through 9G.

Referring to FIG. 4, a plurality of pixel electrodes including the first pixel electrode 101, the second pixel electrode 102, and the third pixel electrode 103 are formed on the substrate 100.

The substrate 100 may be formed by using various suitable materials. For example, the substrate 100 may be formed by using glass or plastic. Plastic may be formed of a material having suitable (e.g., excellent) heat resistance and durability, for example, such as polyimide, polyethylene naphthalate, polyethylene terephthalate, polyarylate, polycarbonate, polyetherimide, polyethersulphone, and/or the like.

In some embodiments, a buffer layer may be further formed to form a planarized surface over an upper surface of the substrate 100, and to prevent or substantially prevent penetration of an impure element into the upper surface of the substrate 100. For example, the buffer layer may include a single layer or multiple layers including silicon nitride, silicon oxide, a combination thereof, and/or the like.

The first to third pixel electrodes 101, 102, and 103 may be formed from a conductive material layer. For example, a conductive material layer may be formed and then patterned to have an island or island-type pattern (or isolated pattern) to form the first to third pixel electrodes 101, 102, and 103.

In some embodiments, the conductive material layer may include a reflective layer including, for example, magnesium (Mg), aluminum (Al), platinum (Pt), palladium (Pd), gold (Au), nickel (Ni), neodymium (Nd), iridium (Ir), chrome (Cr), or any suitable compound thereof. In some embodiments, the conductive material layer may further include, in addition to the above-described reflective layer, a transparent conductive oxide (TCO) layer arranged on and/or below the reflective layer. In some embodiments, the conductive material layer may be a thin film including, for example, silver (Ag) or an Ag alloy. In some embodiments, the conductive material layer may further include, in addition to the above-described thin film, a TCO layer arranged on and/or below the thin film. According to the conductive material layer, the first to third pixel electrodes 101, 102, and 103 may include or be a reflective layer or a light-transmissive electrode.

An insulating layer may be formed on the substrate 100 on which the first to third pixel electrodes 101, 102, and 103 are arranged. Then, the insulating layer on the substrate 100 may be patterned to form the pixel-defining layer 110 that includes a step or step-type height difference. The pixel-defining layer 110 may cover ends of the first to third pixel electrodes 101, 102, and 103.

Referring to FIG. 5, a shape of the pixel-defining layer 110 including the step or step-type height difference is described in more detail.

The pixel-defining layer 110 may include a first surface S1, a second surface S2, a third surface S3, a fourth surface S4, a fifth surface S5, a sixth surface S6, and a seventh surface S7. The first surface S1 may be in contact with the first pixel electrode 101, and may have a first inclination angle $\theta1$ (e.g., with respect to the first pixel electrode 101). The second surface S2 may extend from an end of the first surface S1 in a direction parallel to or substantially parallel to a direction in which the substrate 100 extends. The third surface S3 may extend from an end of the second surface S2, and may have a second inclination angle $\theta2$ (e.g., with respect to the direction in which the second surface S2 extends). The fourth surface S4 may extend from an end of the third surface S3 in a direction parallel to or substantially parallel to the direction in which the substrate 100 extends. The fifth surface S5 may extend from an end of the fourth surface S4, and may have a third inclination angle $\theta3$ (e.g., with respect to a direction in which the sixth surface S6 extends). The sixth surface S6 may extend from an end of the fifth surface S5 in a direction parallel to or substantially parallel to the direction in which the substrate 100 extends. The seventh surface S7 may extend from an end of the sixth surface S6, and may have a fourth inclination angle $\theta4$ (e.g., with respect to the second pixel electrode 102).

The first to fourth inclination angles $\theta1$, $\theta2$, $\theta3$, and $\theta4$ may be the same or substantially the same inclination angle as each other, or two or more of those angles may be different inclination angles from each other. For example, the first inclination angle $\theta1$ may be formed to be the same or substantially the same as (e.g., identical to) the fourth inclination angle $\theta4$, and the second inclination angle $\theta2$ may be formed to be the same or substantially the same as (e.g., identical to) the third inclination angle $\theta3$. Accordingly, in some embodiments, the pixel-defining layer 110 may have a symmetrical or substantially symmetrical shape. In some embodiments, the first inclination angle $\theta1$ may not be a fixed inclination angle, but may be an inclination angle that varies at one or more points (e.g., at each point) along the first surface S1. Similarly, in some embodiments, one or more of (e.g., each of) the second to fourth inclination angles $\theta2$, $\theta3$, and $\theta4$ may not be a fixed inclination angle, but an inclination angle that varies at one or more points (e.g., at each point) along the third surface S3, the fifth surface S5, and the seventh surface S7, respectively.

FIG. 5 shows that each of the second surface S2, the fourth surface S4, and the sixth surface S6 has a flat or substantially flat surface without an inclination. However, inclination angles of the second surface S2, the fourth surface S4, and the sixth surface S6 are not limited to 0 degrees. For example, in other embodiments, the second surface S2, the fourth surface S4, and the sixth surface S6 may have smaller or substantially smaller (e.g., remarkably smaller) inclinations than those of the first surface S1, the third surface S3, the fifth surface S5, and/or the seventh surface S7.

In the present embodiment, the pixel-defining layer 110 includes a step or step-type height difference SC1 between the first surface S1 and the fourth surface S4. Thus, compared to a surface S0 of another (e.g., a virtual) pixel-defining layer that does not include a height difference (e.g., a step or step-type height difference), a space (e.g., a recessed space) SP that is recessed in a direction toward a center (or central area) of the pixel-defining layer 110 may be defined (e.g., formed or ensured) in the pixel-defining layer 110 according to the present embodiment. When the pixel defining layer 110 does not include such a recessed space SP, a space below an undercut may be reduced due to an overhang structure in which an edge of a photoresist sags down during a process of forming a passivation layer, which will be described in more detail below. However, according to one or more embodiments of the present disclosure, the pixel defining layer 110 may include the recessed space SP, such that the space may be secured and a subsequent process may be smoothly performed even when the photoresist sags down during the process of depositing the passivation layer. This will be described in more detail below.

The pixel-defining layer 110 may include an organic insulating material or an inorganic insulating material.

The organic insulating material may include an organic insulating material such as, for example, a general-purpose polymer (polymethyl methacrylate (PMMA) or polystyrene (PS)), an acrylic-based polymer, an imide-based polymer, an aryl ether-based polymer, an amide-based polymer, a fluorine-based polymer, a p-xylene-based polymer, a vinyl alcohol-based polymer, or a blend thereof. The inorganic insulating material may include, for example, at least one selected from silicon nitride, silicon oxide, and silicon oxynitride.

FIG. 5 illustrates a case in which the pixel-defining layer 110 includes an organic insulating material or an inorganic insulating material. However, the present disclosure is not limited thereto, and in another embodiment, the pixel-defining layer 110 may include both an organic insulating material and an inorganic insulating material.

For example, referring to FIG. 6, the pixel-defining layer 110 may have a structure including a first layer 111 and a second layer 112. The first layer 111 may include an organic insulating material including the step or step-type height difference SC1, and the second layer 112 may cover (e.g., completely or entirely cover) the first layer 111. The second layer 112 may include an inorganic insulating material including the step or step-type height difference SC1.

Referring to FIG. 7, the pixel-defining layer 110 may have a structure including a first layer 113, a second layer 114, and a third layer 115. The first layer 113 may include an inorganic insulating material, the second layer 114 may include an organic insulating material and may have a lower surface that is smaller than an upper surface of the first layer 113, and the third layer 115 may include an inorganic insulating material and may cover the second layer 114. The pixel-defining layer 110 has a structure including the step or step-type height difference SC1, as the second layer 114 is formed such that the lower surface of the second layer 114 is smaller than the upper surface of the first layer 113.

As shown in FIGS. 6 and 7, an outermost portion of the pixel-defining layer 110 is surrounded by an inorganic insulating material. Thus, in a wet process such as a process of removing a lift-off layer that is to be described in more detail later, moisture may be prevented or substantially prevented from penetrating into the pixel-defining layer 110, and thus, prevented or substantially prevented from affecting a light-emitting diode.

Referring to FIG. 8, the pixel-defining layer 110 may have a structure including two step or step-type height differences SC1 and SC2. However, the present disclosure is not limited thereto, and in other embodiments, the pixel defining layer 110 may have a structure including three or more height differences (e.g., steps or step-type height differences). The height differences (e.g., the steps or step-type height differences) may also be included to have an asymmetrical shape, instead of a symmetrical shape (e.g., a bilaterally symmetrical shape).

In some embodiments, referring to FIG. 4, the first to third pixel electrodes 101, 102, and 103 may be formed to be electrically connected to first to third thin-film transistors, respectively. For example, the first to third thin-film transistors may be located between the substrate 100 and the first to third pixel electrodes 101, 102, and 103, and may be connected to the first to third pixel electrodes 101, 102, and 103, respectively.

The auxiliary electrode 120 that is spaced apart from the first to third pixel electrodes 101, 102, and 103 is arranged on the pixel-defining layer 110. The auxiliary electrode 120 may surround each of the first to third pixel electrodes 101, 102, and 103, and be formed to have a closed loop shape.

Figure 9A:
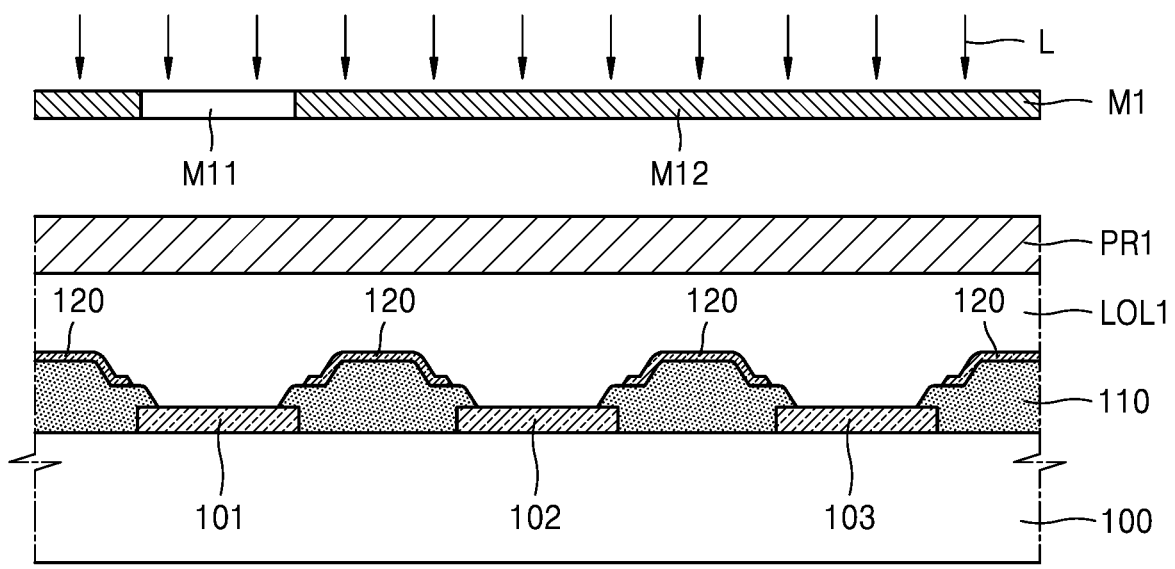
FIGS. 9A-9G are schematic cross-sectional views illustrating a first unit process of the organic light-emitting display apparatus according to an embodiment.

Referring to FIG. 9A, a first lift-off layer LOL1 and a first photoresist PR1 are formed (e.g., sequentially formed) on the structure of FIG. 4.

The first lift-off layer LOL1 may include a non-photosensitive organic material. The first lift-off layer LOL1 may include a fluoropolymer. The fluoropolymer included in the first lift-off layer LOL1 may include a polymer including fluorine of about 20 wt % (weight percent) to about 60 wt %. For example, the fluoropolymer may include at least one selected from among polytetrafluoroethylene, polychlorotrifluoroethylene, and polydichlorodifluoroethylene. For example, the fluoropolymer may include at least one selected from among a copolymer of dichloro-difluoroethylene with chlorotrifluoroethylene, a copolymer of tetrafluoroethylene with perfluoroalkylvinylether, and a copolymer of chlorotrifluoroethylene with perfluoroalkylvinylether. The first lift-off layer LOL1 may be formed by using any suitable method, for example, such as a coating method, a printing method, a deposition method, or the like.

The first photoresist PR1 is formed on the first lift-off layer LOL1. A portion of the first photoresist PR1 at (e.g., in or on) a position corresponding to the first pixel electrode 101 is exposed through a first photomask M1 that includes a light-transmissive portion M11 and a light-blocking portion M12.

Figure 9B:
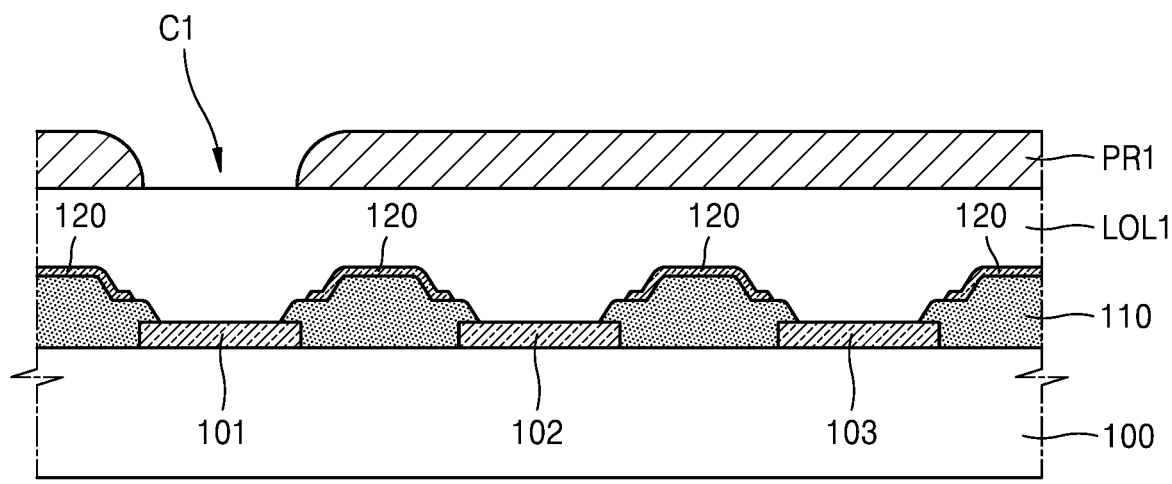

Referring to FIG. 9B, the first photoresist PR1 is developed. The first photoresist PR1 may be any of a positive type photoresist and a negative type photoresist. In the present embodiment, the first photoresist PR1 of a positive type is described as an example. At (e.g., in or on) a portion of the developed first photoresist PR1 corresponding to the first pixel electrode 101, a first opening C1 is formed.

Figure 9C:
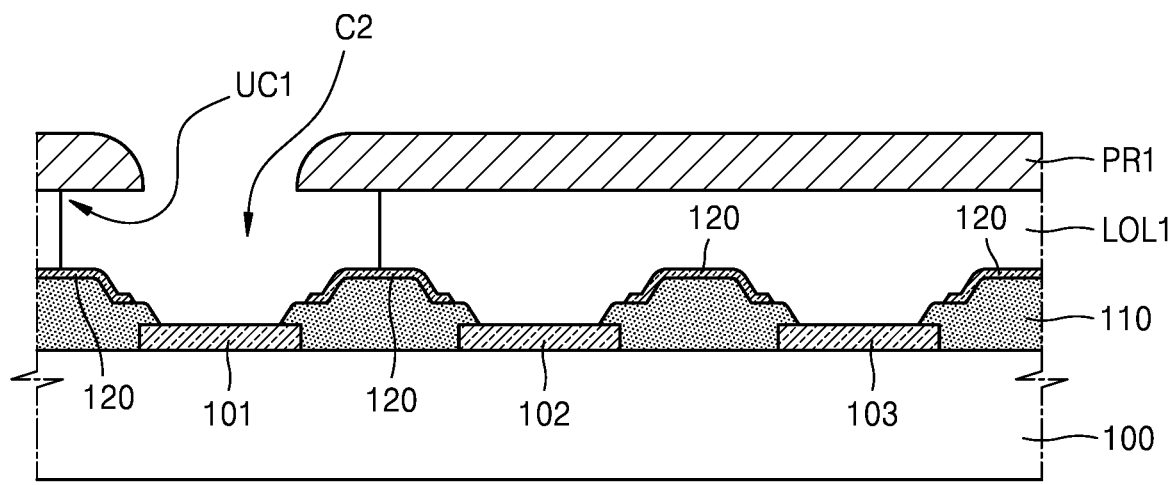

Referring to FIG. 9C, the first lift-off layer LOL1 is etched by using the first photoresist PR1 that is developed in FIG. 9B as an etching mask.

When the first lift-off layer LOL1 includes a fluoropolymer, a solvent that may etch a fluoropolymer is used as an etchant. A first solvent may include hydrofluoroether. Hydrofluoroether is an electrochemically stable material due to low interaction with other materials, and also an environmentally stable material due to a low global warming potential and low toxicity.

When the first lift-off layer LOL1 is etched by performing an etching process, the first solvent that includes fluorine forms a first undercut UC1 below the first opening C1 in the first photoresist PR1, and a second opening C2 is formed that exposes an upper surface of the first pixel electrode 101, a part of the pixel-defining layer 110, and an upper surface of the auxiliary electrode 120. As the first undercut UC1 is formed, a large deposition space may be defined (e.g., ensured) on the first pixel electrode 101.

Figure 9D:
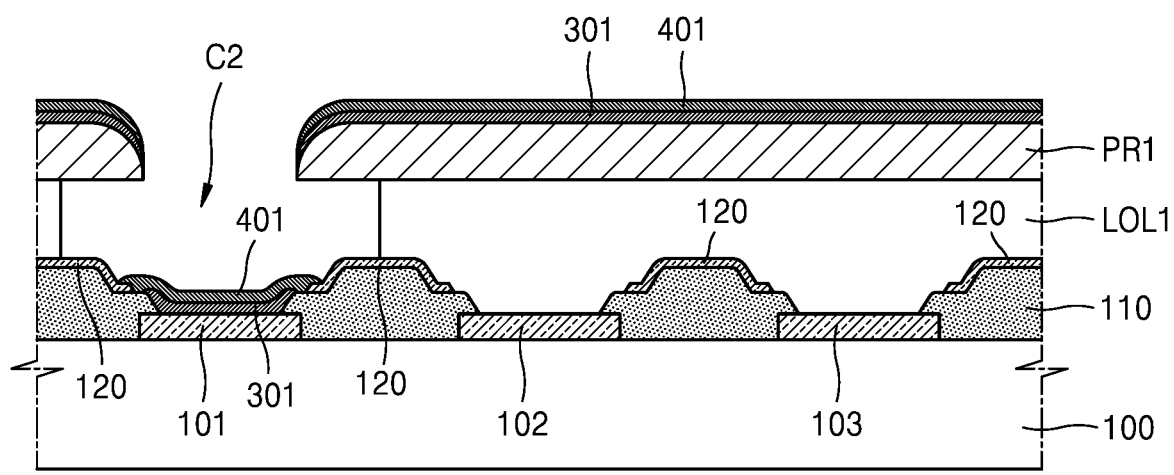

Referring to FIG. 9D, the first intermediate layer 301 including the first light-emitting layer, and the first opposite electrode 401 are formed on the structure of FIG. 9C.

The first intermediate layer 301 and the first opposite electrode 401 are formed by using vacuum deposition. A deposition source is arranged on a chamber. Then, deposition is performed by adjusting a deposition incidence angle so that a material discharged from the deposition source is incident toward the substrate 100.

The first intermediate layer 301 may be formed to further include at least one selected from a hole injection layer, a hole transport layer, an electron transport layer, and an electron injection layer, in addition to the first light-emitting layer.

The first opposite electrode 401 may be a light-transmissive electrode or a reflective electrode. In an example embodiment, the first opposite electrode 401 may include a metal thin film or a metal thick film including, for example, at least one material selected from Ag, Mg, Al, ytterbium (Yb), calcium (Ca), lithium (Li), and gold (Au). Because the first opposite electrode 401 is formed to cover the first intermediate layer 301, the first opposite electrode 401 may function as a protective layer to protect the first intermediate layer 301 that may be fragile to moisture and/or oxygen.

The first intermediate layer 301 is deposited on the upper surface of the first pixel electrode 101, and on a part (or a portion) of the pixel-defining layer 110, each located at (e.g., in or on) the second opening C2. The first intermediate layer 301 may also be deposited on an upper portion of the first photoresist PR1.

The first opposite electrode 401 is deposited on (e.g., over) the upper surface of the first pixel electrode 101, and on a part (or portion) of the pixel-defining layer 110, each located at (e.g., in or on) the second opening C2. The first opposite electrode 401 may also be deposited on (e.g., over) the upper portion of the first photoresist PR1.

The first intermediate layer 301 and the first opposite electrode 401 may be deposited by using a PVD process. In an embodiment, the first intermediate layer 301 may be deposited by using a process selected from among, for example, a sputtering method, a thermal evaporation method, an E-beam evaporation method, a laser molecular beam epitaxy method, and a pulsed laser deposition method. The first opposite electrode 401 is formed to cover the first intermediate layer 301 and to be in contact with the auxiliary electrode 120 by adjusting a deposition incidence angle, a chamber pressure, a temperature, reaction gas, and/or the like.

Figure 9E:
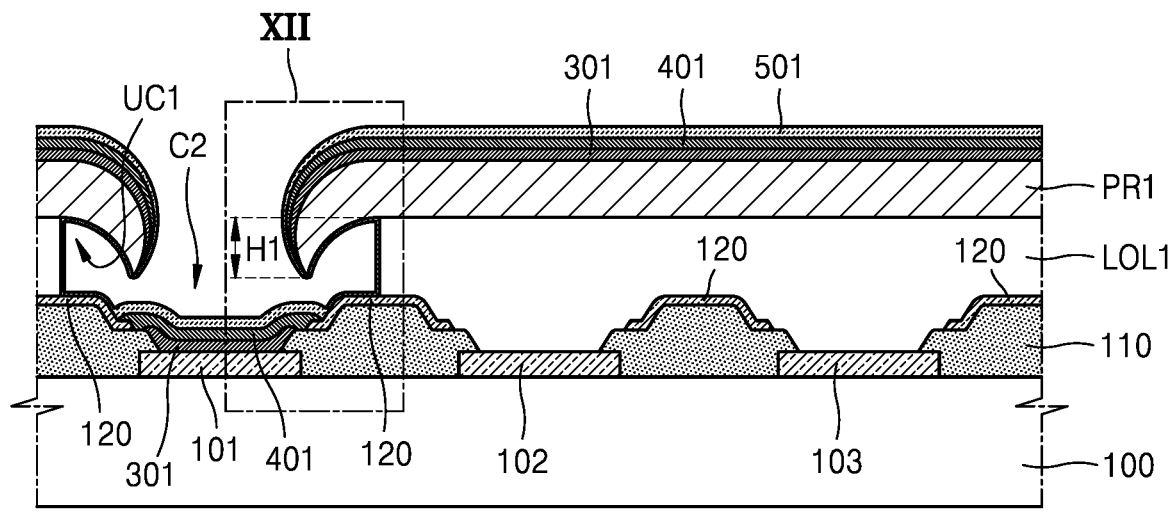

Referring to FIG. 9E, the first passivation layer 501 is formed on the structure of FIG. 9D. The first passivation layer 501 is formed to cover (e.g., completely or entirely cover) an upper surface of the first opposite electrode 401 and ends of the first opposite electrode 401. The first passivation layer 501 may be deposited by using a CVD process or an ALD process that provides a more suitable (e.g., excellent) step coverage than that of a PVD process. In an embodiment, the first passivation layer 501 may be deposited by using a process selected from among, for example, a thermal CVD process, a plasma CVD process, a metal-organic chemical vapor deposition (MOCVD) process, and a hydride vapor phase epitaxy (HVPE) process.

As a result of performing the CVD process or the ALD process, the first passivation layer 501 is also deposited on (e.g., over) the upper surface of the first photoresist PR1. In addition, at (e.g., in or on) an area in which the first undercut UC1 is formed, the first passivation layer 501 is also deposited on a lower surface of the first photoresist PR1, an upper surface of the auxiliary electrode 120, and a side surface of the first lift-off layer LOL1.

In an example embodiment, during the depositing of the first passivation layer 501 by using the CVD process or the ALD process, an end of the first photoresist PR1 including the first undercut UC1 sags towards the substrate 100 due to a compressive stress on the first passivation layer 501, and an overhang structure is formed. In other words, the end of the first photoresist PR1 is lowered towards the substrate 100 by a suitable height (e.g., a predetermined height) H1 compared to the lower surface of the first photoresist PR1 before the compressive stress occurs. Thus, a space between the lower surface of the first photoresist PR1 having the overhang structure and the first passivation layer 501 arranged at (e.g., in or on) the second opening C2 is reduced.

Due to the sagging at (e.g., in or on) the overhang structure, as the space between the lower surface of the first photoresist PR1 and the first passivation layer 501 arranged at (e.g., in or on) the second opening C2 is reduced, a process margin of a dry-etching process that is to be described in more detail later may be reduced. Thus, a problem in which the first lift-off layer LOL1 is not completely removed may occur. However, as described with reference to FIG. 5, in the present embodiment, because the pixel-defining layer 110 is formed to have a structure including the step or step-type height difference SC1 (e.g., refer to FIG. 5), the recessed space SP (e.g., shown in FIG. 5) is formed at (e.g., in or on) the pixel-defining layer 110. Thus, a margin in a subsequent process may be secured or ensured.

Referring to FIG. 12, which is an enlarged view of the region XII of FIG. 9E, in a vicinity of an area at which the first undercut UC1 is formed, a thickness D2 of the first passivation layer 501 that is deposited on the lower surface of the first photoresist PR1, the upper surface of the auxiliary electrode 120, and the side surface of the first lift-off layer LOL1 may be less than a thickness D1 of the first passivation layer 501 that is deposited on the upper surface of the first opposite electrode 401, and less than a thickness D3 of the first passivation layer 501 that is deposited on (e.g., over and/or to overlap with) the upper surface of the first lift-off layer LOL1.

In other words, the first passivation layer 501 may include a first portion having the thickness D1, a second portion having the thickness D2, and a third portion having the thickness D3. The first portion may be defined as a portion of the first passivation layer 501 that is on the upper surface of the first opposite electrode 401. The second portion may be defined as a portion of the first passivation layer 501 that is on the lower surface of the first photoresist PR1, the upper surface of the auxiliary electrode 120, and the side surface of the first lift-off layer LOL1. The third portion may be defined as a portion of the first passivation layer 501 that overlaps with the upper surface of the first lift-off layer LOL1. The thickness D2 of the second portion of the first passivation layer 501 may be less than each of the thicknesses D1 and D3 of the first and third portions of the first passivation layer 501, respectively.

Figure 9F:
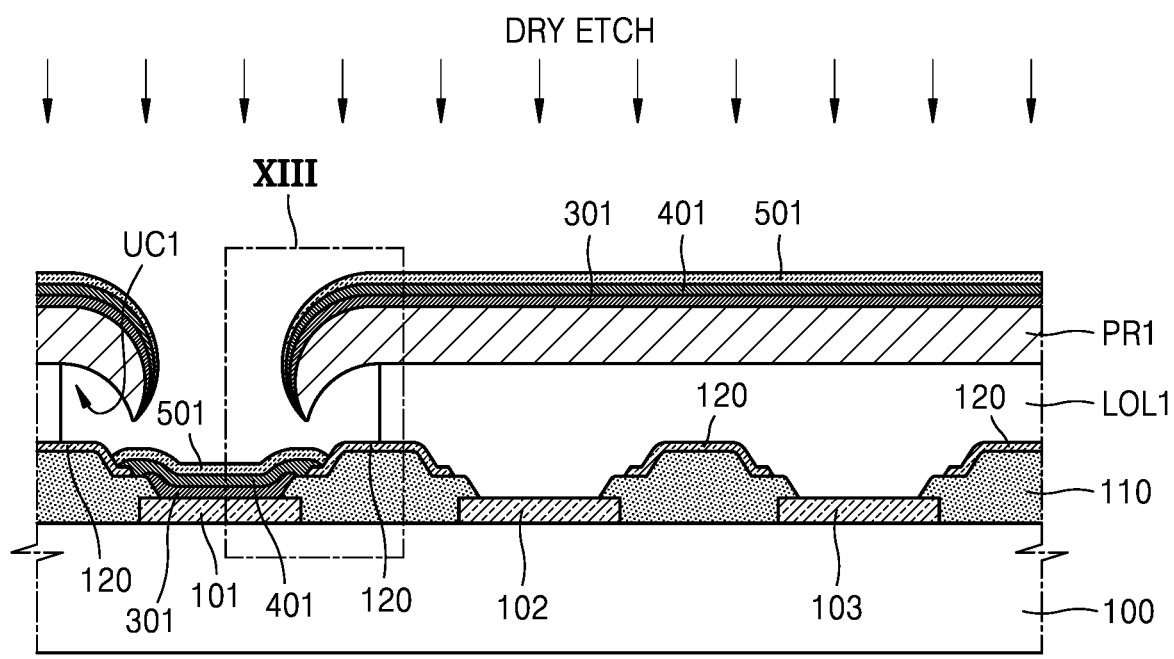

Referring to FIG. 9F, a dry-etching process is performed on a structure of FIG. 9E. As a result of performing the dry-etching process, the first passivation layer 501 is etched and removed from the vicinity of the area at which the first undercut UC1 is formed.

Referring to FIG. 13, which is an enlarged view of the region XIII of FIG. 9F, it is shown that a thickness of the first passivation layer 501 is reduced. For example, a thickness D1 of the first portion of the first passivation layer 501 that is deposited on the upper surface of the first opposite electrode 401 shown in FIG. 13 is reduced when compared to the thickness D1 of the first portion of the first passivation layer 501 shown in FIG. 12 prior to the dry-etching process of FIG. 9F. Similarly, a thickness D3' of the third portion of the first passivation layer 501 that is deposited on (e.g., over and/or to overlap with) the upper surface of the first lift-off layer LOL1 shown in FIG. 13 is reduced when compared to the thickness D3 of the third portion of the first passivation layer 501 shown in FIG. 12 prior to the dry-etching process of FIG. 9F. In the vicinity of the area at which the first undercut UC1 is formed, a thickness D2' of the second portion of the first passivation layer 501 that is deposited on the lower surface of the first photoresist PR1, the upper surface of the auxiliary electrode 120, and the side surface of the first lift-off layer LOL1 is reduced, and thus, removed or completely (e.g., entirely) removed, when compared to the thickness D2 of the second portion the first passivation layer 501 shown in FIG. 12 before the dry-etching process of FIG. 9F is performed.

Figure 9G:
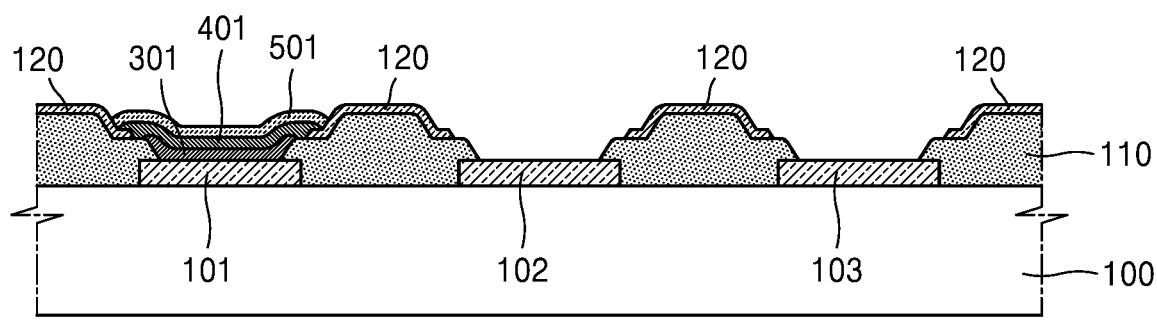

Referring to FIG. 9G, a lift-off process is performed on a structure of FIG. 9F. The lift-off process may be performed outside a chamber. For example, in an embodiment, the lift-off process may be performed in a suitable atmosphere at room temperature.

When the first lift-off layer LOL1 includes a fluoropolymer, the first lift-off layer LOL1 may be removed by using a second solvent containing or including fluorine. Because the lift-off process is performed after the first intermediate layer 301 including the first light-emitting layer is deposited, a material having a low reactivity with the first intermediate layer 301 may be used as the second solvent. For example, similar to the first solvent, the second solvent may contain or include hydrofluoroether.

As a result of the lift-off process, each of the first intermediate layer 301, the first opposite electrode 401, and the first passivation layer 501 that are arranged on the first pixel electrode 101 remain as patterns.

In the present embodiment, because the first passivation layer 501 is formed by using a deposition method that provides a large step coverage, the first passivation layer 501 covers (e.g., completely or entirely covers) the first opposite electrode 401 to protect the first opposite electrode 401 and the first intermediate layer 301 from being damaged during the lift-off process, which may include a wet process.

As a result of performing a process that provides a large step coverage, the first passivation layer 501 that is deposited in the vicinity of the area at which the first undercut UC1 is formed, for example, at an area A1 shown in FIG. 12 in which a lower surface of the first lift-off layer LOL1 meets an upper surface of the pixel-defining layer 110 (e.g., and/or contacts an upper surface of the auxiliary electrode 120) may be an obstacle during the lift-off process. However, in the present embodiment, the lift-off process may be performed after the first passivation layer 501 at (e.g., in or on) the area A1 is removed, for example, by performing dry-etching.

In addition, in the present embodiment, the recessed portion SP (e.g., shown in FIG. 5) may be formed by forming the pixel-defining layer 110 to have a structure including the step or step-type height difference SC1. Thus, a margin in the dry-etching process may be secured or ensured.

Hereinafter, a second unit process is described. Redundant description that has been provided above with reference to the first unit process may not be repeated.

Figure 10A:
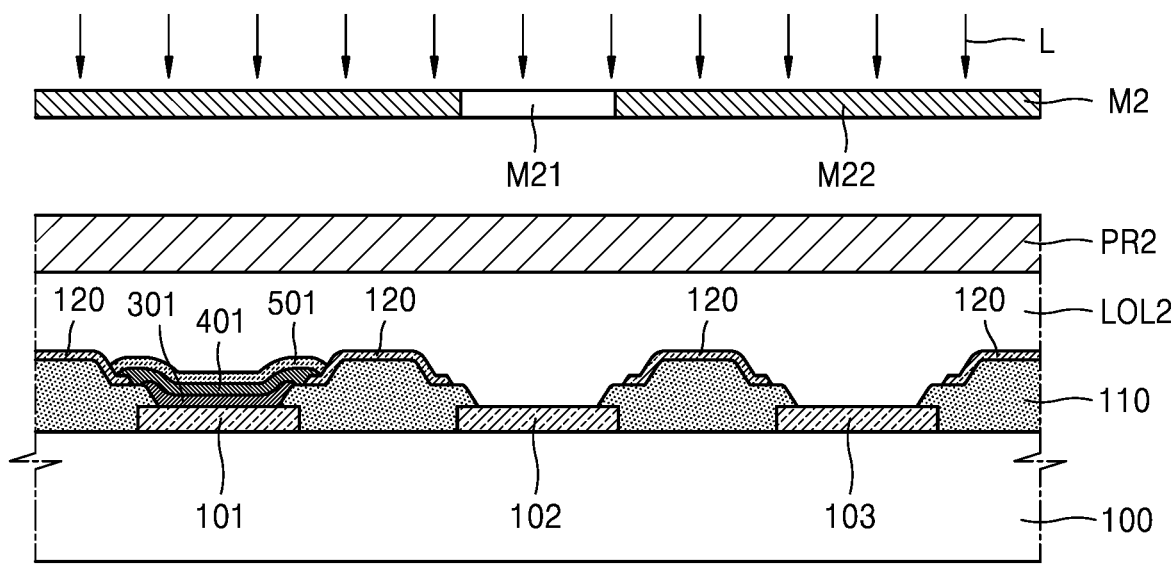
FIGS. 10A-10G are schematic cross-sectional views illustrating a second unit process of the organic light-emitting display apparatus according to an embodiment.

Referring to FIG. 10A, a second lift-off layer LOL2 and a second photoresist PR2 are formed (e.g., sequentially formed) on the structure of FIG. 9G.

The second lift-off layer LOL2 may include the same or substantially the same material as that of the first lift-off layer LOL1. The second lift-off layer LOL2 may be formed by using any suitable method, for example, such as a coating method, a printing method, a deposition method, or the like.

The second photoresist PR2 is formed on the second lift-off layer LOL2. A portion of the second photoresist PR2 that corresponds to the second pixel electrode 102 is exposed through a second photomask M2 that includes a light-transmissive portion M21 and a light-blocking portion M22.

Figure 10B:
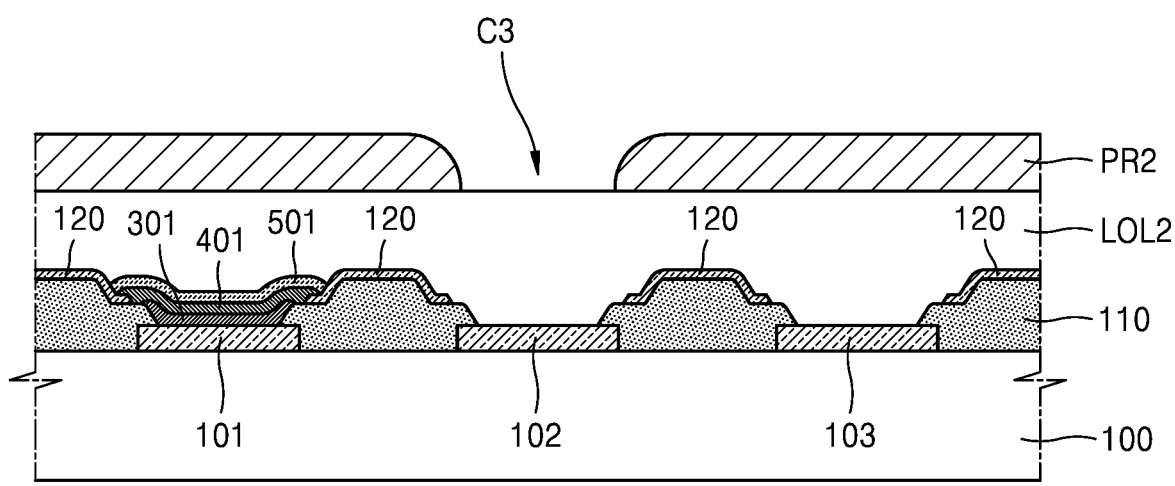

Referring to FIG. 10B, the second photoresist PR2 is developed. At (e.g., in or on) a portion of the developed second photoresist PR2 that corresponds to the second pixel electrode 102, a third opening C3 is formed.

Figure 10C:
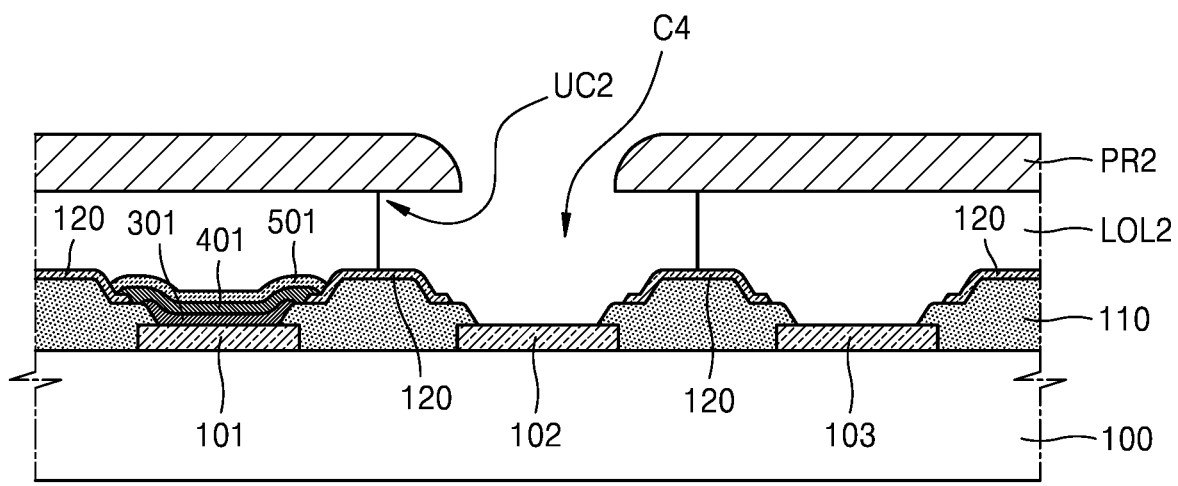

Referring to FIG. 10C, the second lift-off layer LOL2 is etched by using the second photoresist PR2 that is developed in FIG. 10B as an etching mask.

When the second lift-off layer LOL2 includes a fluoropolymer, a solvent that may etch a fluoropolymer is used as an etchant. A first solvent may contain or include hydrofluoroether.

When the second lift-off layer LOL2 is etched by performing an etching process, the first solvent that contains or includes fluoropolymer forms a second undercut UC2 below the third opening C3 of the second photoresist PR2, and a fourth opening C4 is formed that exposes an upper surface of the second pixel electrode 102, a part of the pixel-defining layer 110, and an upper surface of the auxiliary electrode 120. As the second undercut UC1 is formed, a large deposition space may be secured or ensured on the second pixel electrode 102.

Figure 10D:
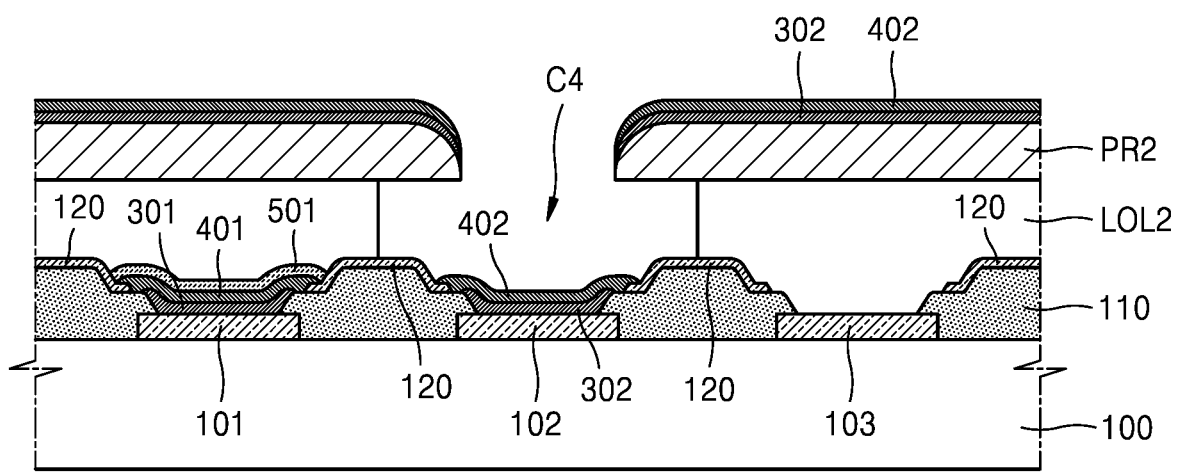

Referring to FIG. 10D, the second intermediate layer 302 including the second light-emitting layer, and the second opposite electrode 402 are formed on the structure of FIG. 10C.

The second intermediate layer 302 and the second opposite electrode 402 are formed by using, for example, vacuum deposition. A deposition source is arranged on a chamber. Then, deposition is performed by adjusting a deposition incidence angle so that a material discharged from the deposition source is incident toward the substrate 100.

The second intermediate layer 302 may be formed to further include at least one selected from a hole injection layer, a hole transport layer, an electron transport layer, and an electron injection layer, in addition to the second light-emitting layer.

The second opposite electrode 402 may be a light-transmissive electrode or a reflective electrode. As the second opposite electrode 402 is formed to cover the second intermediate layer 302, the second opposite electrode 402 may function as a protective layer to protect the second intermediate layer 302 that may be fragile to moisture and/or oxygen.

The second intermediate layer 302 is deposited on the upper surface of the second pixel electrode 102, and on a part (or a portion) of the pixel-defining layer 110, each arranged at (e.g., in or on) the fourth opening C4. The second intermediate layer 302 may also be deposited on an upper portion of the second photoresist PR2.

The second opposite electrode 402 is deposited on (e.g., over) the upper surface of the second pixel electrode 102, on a part (or a portion) of the pixel-defining layer 110, and on a part (or a portion) of the auxiliary electrode 120, each located at (e.g., in or on) the fourth opening C4. The second opposite electrode 402 is also deposited on (e.g., over) the upper portion of the second photoresist PR2.

Similar to the first unit process, the second intermediate layer 302 and the second opposite electrode 402 may be deposited by using a PVD process. The second opposite electrode 402 is formed to cover the second intermediate layer 302 and to be in contact with the auxiliary electrode 120 by adjusting a deposition incidence angle, a chamber pressure, a temperature, reaction gas, and/or the like.

Figure 10E:
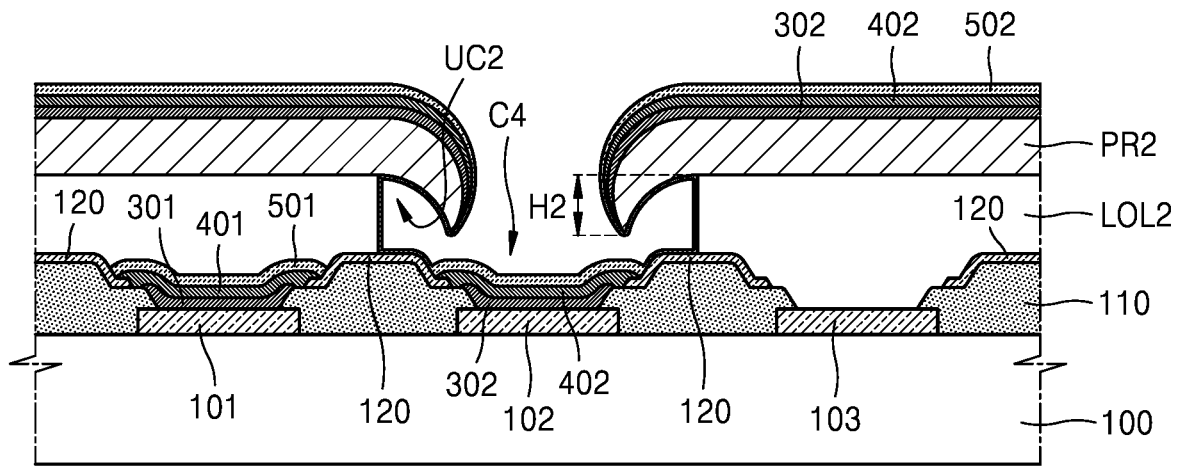

Referring to FIG. 10E, the second passivation layer 502 is formed on the structure of FIG. 10D. The second passivation layer 502 is formed to cover (e.g., completely or entirely cover) an upper surface of the second opposite electrode 402 and ends of the second opposite electrode 402. The second passivation layer 502 may be deposited by using a CVD process or an ALD process, each providing a more suitable (e.g., excellent) step coverage than that of a PVD process.

As a result of performing the CVD process or the ALD process, the second passivation layer 502 is deposited on (e.g., over) the upper portion of the second photoresist PR2. In addition, at (e.g., in or on) an area in which the second undercut UC2 is formed, the second passivation layer 502 is also deposited on a lower surface of the second photoresist PR2, an upper surface of the pixel-defining layer 110, and a side surface of the second lift-off layer LOL2.

In an example embodiment, during the depositing of the second passivation layer 502 by using the CVD process or the ALD process, an end of the second photoresist PR2 including the second undercut UC2 sags towards the substrate 100 due to a compressive stress on the second passivation layer 502, and an overhang structure is formed. In other words, the end of the second photoresist PR2 is lowered towards the substrate 100 by a suitable height (e.g., a predetermined height) H2 compared to a lower surface of the second photoresist PR2 before the compressive stress occurs. Thus, a space between the lower surface of the second photoresist PR2 having the overhang structure and the second passivation layer 502 arranged at (e.g., in or on) the fourth opening C4 is reduced. However, as described with reference to FIG. 5, in the present embodiment, because the pixel-defining layer 110 is formed to have a structure including the step or step-type height difference SC1 (e.g., refer to FIG. 5), the recessed space SP is formed at (e.g., in or on) the pixel-defining layer 110. Thus, a margin in a subsequent process may be secured or ensured.

Figure 10F:
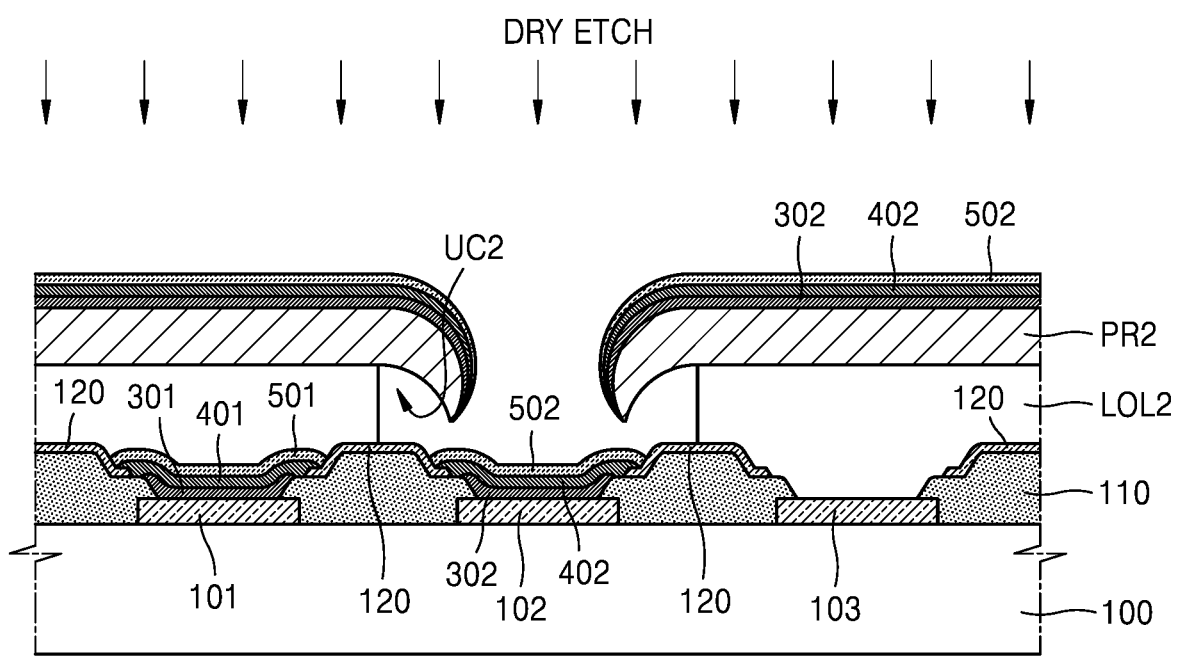

Referring to FIG. 10F, a dry-etching process is performed on the structure of FIG. 10E. As a result of performing the dry-etching process, the second passivation layer 502 is etched and removed from a vicinity of the area in which the second undercut UC2 is formed.

Figure 10G:
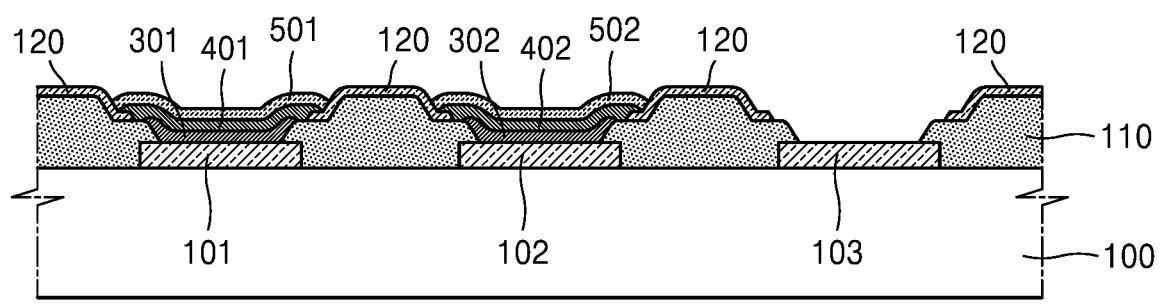

Referring to FIG. 10G, a lift-off process is performed on the structure of FIG. 10F. The lift-off process may be performed outside a chamber. For example, in an embodiment, the lift-off process may be performed in a suitable atmosphere at room temperature.

When the second lift-off layer LOL2 includes a fluoropolymer, the second lift-off layer LOL2 may be removed by using a second solvent containing or including fluorine. Because the lift-off process is performed after the second intermediate layer 302 including the second light-emitting layer is deposited, a material having a low reactivity with the second intermediate layer 302 may be used as the second solvent. For example, similar to the first solvent, the second solvent may contain or include hydrofluoroether.

As a result of the lift-off process, each of the second intermediate layer 302, the second opposite electrode 402, and the second passivation layer 502 that are arranged on the second pixel electrode 102 remain as patterns.

Hereinafter, a third unit process is described. Redundant description provided above with reference to the first and second unit processes may not be repeated.

Figure 11A:
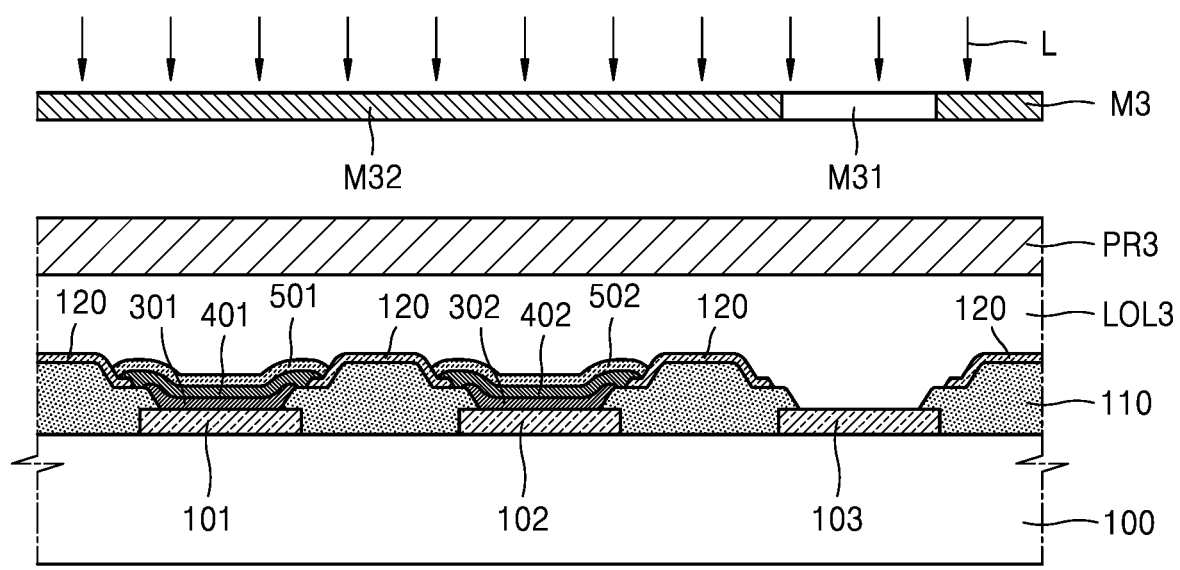
FIGS. 11A-11G are schematic cross-sectional views illustrating a third unit process of the organic light-emitting display apparatus according to an embodiment.

Referring to FIG. 11A, a third lift-off layer LOL3 and a third photoresist PR3 are formed (e.g., sequentially formed) on the structure of FIG. 10G.

The third lift-off layer LOL3 may include the same or substantially the same material as that of the first and/or second lift-off layers LOL1 and LOL2. The third lift-off layer LOL3 may be formed by using a suitable method, for example, such as a coating method, a printing method, a deposition method, or the like.

The third photoresist PR3 is formed on the third lift-off layer LOL3. A portion of the third photoresist PR3 that corresponds to the third pixel electrode 103 is exposed through a third photomask M3 that includes a light-transmissive portion M31 and a light-blocking portion M32.

Figure 11B:
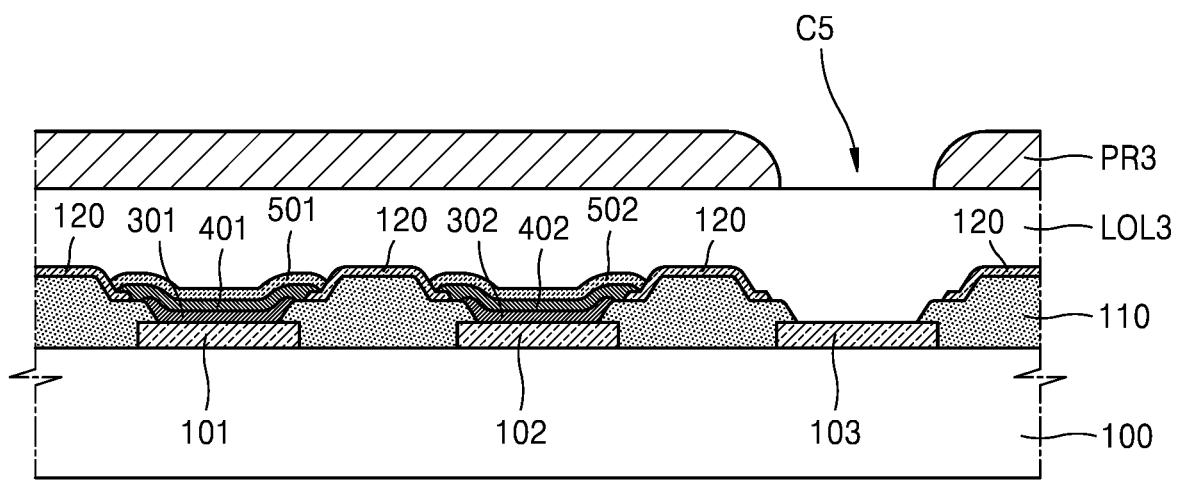

Referring to FIG. 11B, the third photoresist PR3 is developed. At (e.g., in or on) a portion of the developed third photoresist PR3 that corresponds to the third pixel electrode 103, a fifth opening C5 is formed.

Figure 11C:
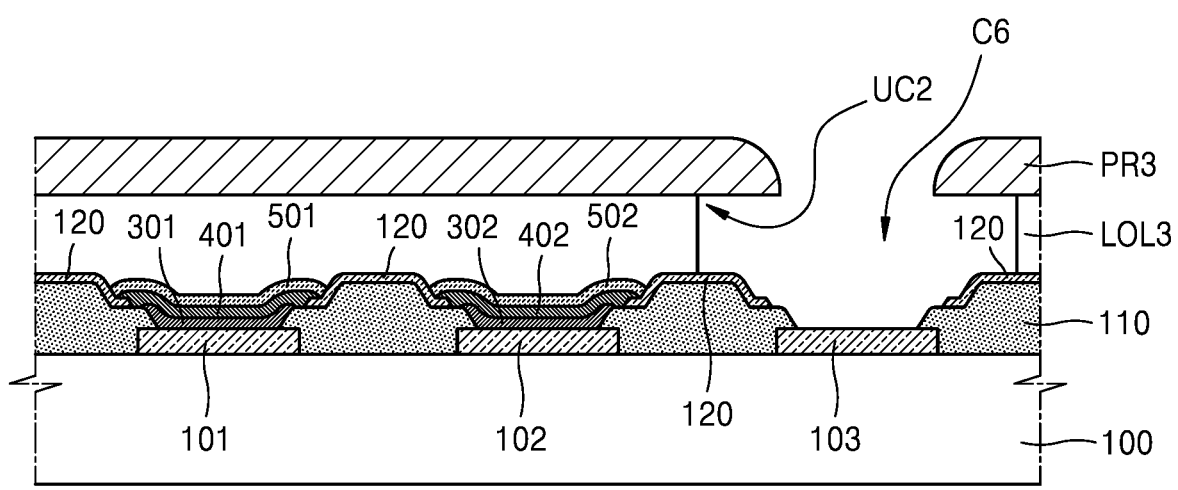

Referring to FIG. 11C, the third lift-off layer LOL3 is etched by using the third photoresist PR3 that is developed in FIG. 11B as an etching mask.

When the third lift-off layer LOL3 includes a fluoropolymer, a solvent that may etch a fluoropolymer is used as an etchant. The first solvent may contain or include hydrofluoroether.

When the third lift-off layer LOL3 is etched by performing an etching process, the first solvent that contains or includes a fluoropolymer forms a third undercut UC3 below the fifth opening C5 in the third photoresist PR3, and a sixth opening C6 is formed that exposes an upper surface of the third pixel electrode 103, a part (or a portion) of the pixel-defining layer 110, and an upper surface of the auxiliary electrode 120. As the third undercut UC3 is formed, a large deposition space may be secured or ensured on the third pixel electrode 103.

Figure 11D:
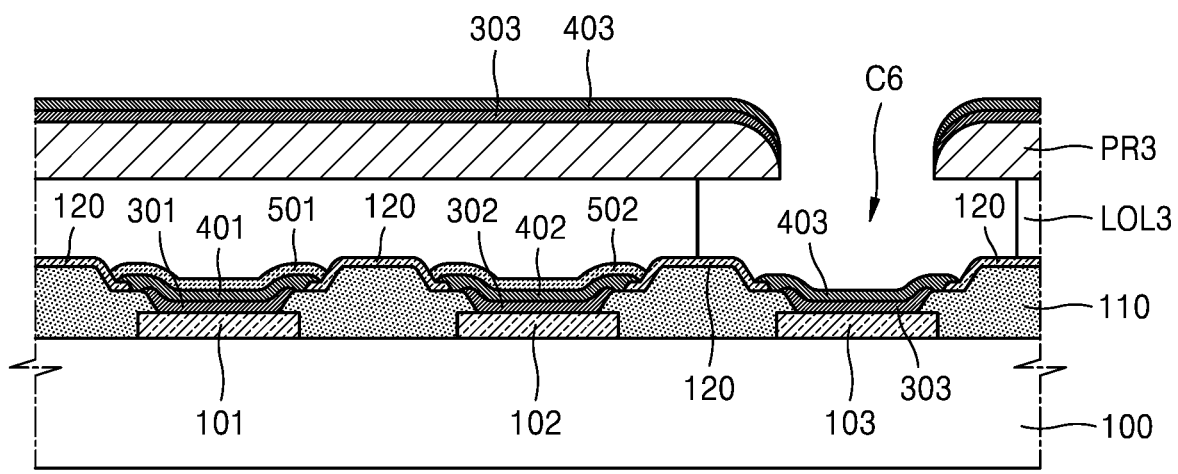

Referring to FIG. 11D, the third intermediate layer 303 including the third light-emitting layer, and the third opposite electrode 403 are formed on the structure of FIG. 11C.

The third intermediate layer 303 and the third opposite electrode 403 are formed by using, for example, vacuum deposition. A deposition source is arranged on a chamber. Then, deposition is performed by adjusting a deposition incidence angle so that a material discharged from the deposition source is incident toward the substrate 100.

The third intermediate layer 303 may be formed to further include at least one selected from a hole injection layer, a hole transport layer, an electron transport layer, and an electron injection layer, in addition to the third light-emitting layer.

The third opposite electrode 403 may be a light-transmissive electrode or a reflective electrode. As the third opposite electrode 403 is formed to cover the third intermediate layer 303, the third opposite electrode 403 may function as a protective layer to protect the third intermediate layer 303 that may be fragile to moisture and/or oxygen.

The third intermediate layer 303 is deposited on the upper surface of the third pixel electrode 103, a part (or a portion) of the pixel-defining layer 110, and an upper portion of the third photoresist PR3.

The third opposite electrode 403 is deposited on the upper surface of the third pixel electrode 103, a part (or a portion) of the pixel-defining layer 110, and a part (or a portion) of the auxiliary electrode 120, each located at (e.g., in or on) the sixth opening C6. The third opposite electrode 402 may also be deposited on (e.g., over) the upper portion of the third photoresist PR3.

Similar to the second unit process, the third intermediate layer 303 and the third opposite electrode 403 may be deposited by using a PVD process. The third opposite electrode 403 is formed to cover the third intermediate layer 303 and to be in contact with the auxiliary electrode 120 by adjusting a deposition incidence angle, a chamber pressure, a temperature, reaction gas, and/or the like.

Figure 11E:
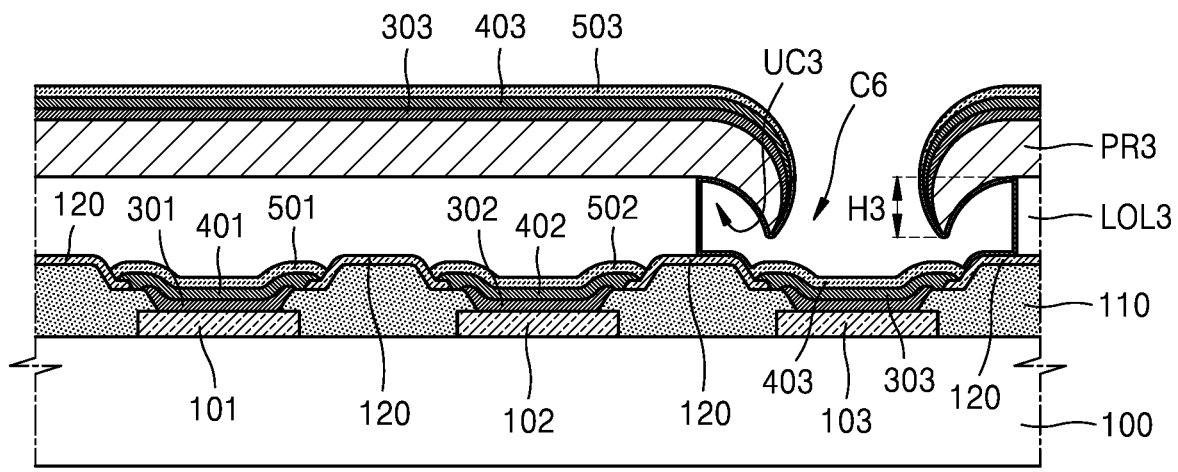

Referring to FIG. 11E, the third passivation layer 503 is formed on the structure of FIG. 11D. The third passivation layer 503 is formed to cover (e.g., completely or entirely cover) an upper surface of the third opposite electrode 403 and ends of the third opposite electrode 403. The third passivation layer 503 may be deposited by using a CVD process or an ALD process, each providing a more suitable (e.g., excellent) step coverage than that of a PVD process.

As a result of performing the CVD process or the ALD process, the third passivation layer 503 is also deposited on (e.g., over) the upper surface of the third photoresist PR3. In addition, at (e.g., in or on) an area in which the third undercut UC3 is formed, the third passivation layer 503 is also deposited on a lower surface of the third photoresist PR3, an upper surface of the pixel-defining layer 110, and a side surface of the third lift-off layer LOL3.

In an example embodiment, during the depositing of the third passivation layer 503 by using the CVD process or the ALD process, an end of the third photoresist PR3 including the third undercut UC3 sags towards the substrate 100 due to compressive stress on the third passivation layer 503, and an overhang structure is formed. In other words, the end of the third photoresist PR3 is lowered towards the substrate 100 by a suitable height (e.g., a predetermined height) H3 compared to a lower surface of the third photoresist PR3 before the compressive stress occurs. Thus, a space between the lower surface of the third photoresist PR3 having the overhang structure and the third passivation layer 503 arranged at (e.g., in or on) the sixth opening C6 is reduced. However, as described with reference to FIG. 5, in the present embodiment, because the pixel-defining layer 110 is formed to have a structure in which the step or step-type height difference SC1 is formed, the recessed space SP (e.g., shown in FIG. 5) is formed at (e.g., in or on) the pixel-defining layer 110. Thus, a margin in a subsequent process may be secured or ensured.

Figure 11F:
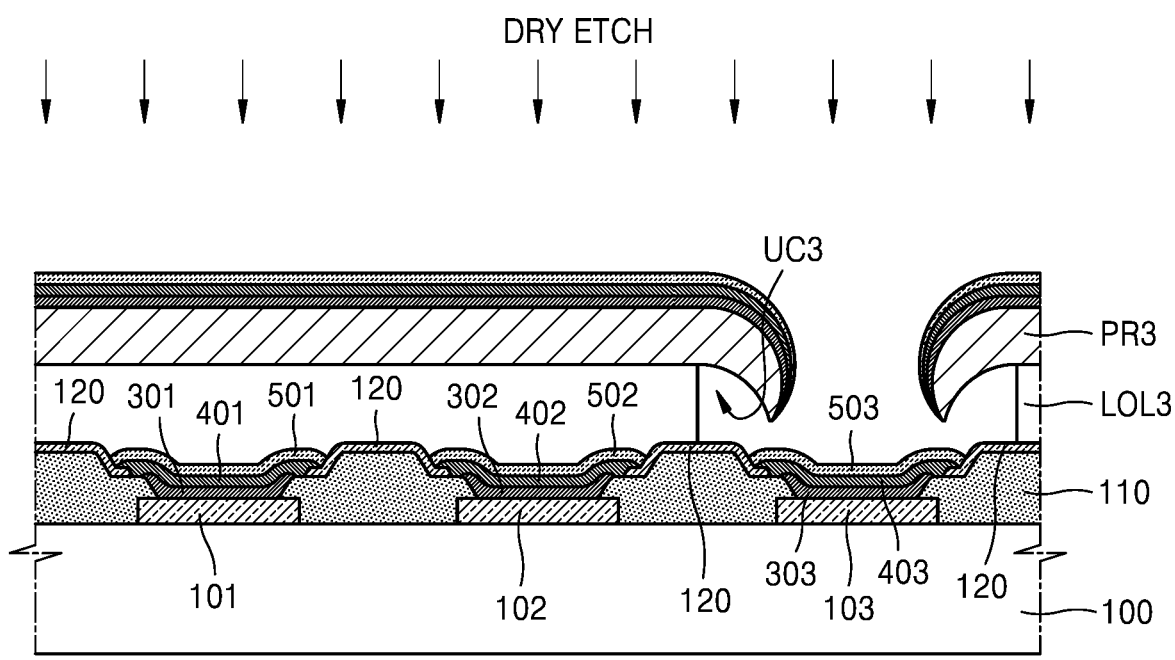

Referring to FIG. 11F, a dry-etching process is performed on the structure of FIG. 11E. As a result of performing the dry-etching process, the third passivation layer 503 is etched and removed at a vicinity of the area in which the third undercut UC3 is formed.

Figure 11G:
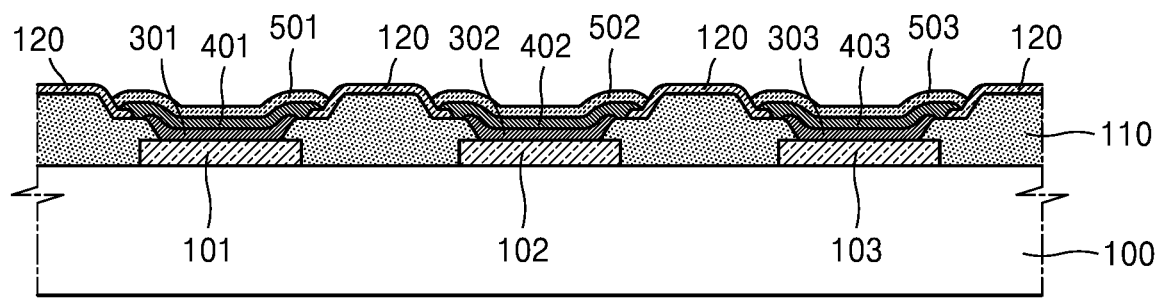

Referring to FIG. 11G, a lift-off process is performed on the structure of FIG. 11F. The lift-off process may be performed outside a chamber. For example, in an embodiment, the lift-off process may be performed in a suitable atmosphere at room temperature.

When the third lift-off layer LOL3 includes a fluoropolymer, the third lift-off layer LOL3 may be removed by using a third solvent containing or including fluorine. Because the lift-off process is performed after the third intermediate layer 303 including the third light-emitting layer is disposed, a material having a low reactivity with the third intermediate layer 303 may be used. For example, similar to the second solvent, the third solvent may contain or include hydrofluoroether.

As a result of the lift-off process, each of the third intermediate layer 303, the third opposite electrode 403, and the third passivation layer 503 that are arranged on the third pixel electrode 103 remains as a pattern.

The encapsulation member 700 (e.g., see FIG. 1) may be arranged on the first to third passivation layers 501, 502, and 503. The encapsulation member 700 may include at least one organic layer and at least one inorganic layer. For example, FIG. 1 shows a structure in which the encapsulation member 700 includes a first inorganic layer 701, an organic layer 702, and a second inorganic layer 703 that are sequentially stacked, but the present disclosure is not limited thereto.

After the first to third unit processes are performed, the encapsulation member 700 (e.g., refer to FIG. 1) is arranged to cover each of the upper surfaces of the first to third passivation layers 501, 502, and 503.

The encapsulation member 700 may prevent or reduce damage to the first to third passivation layers 501, 502, and 503 described above, and/or may prevent or reduce damage to an organic light-emitting diode that may be fragile to moisture, by preventing or substantially preventing penetration of moisture.

As described above, in the present embodiment, because the first to third passivation layers 501, 502, and 503 are formed by using a deposition method that provides a large step coverage, the first to third passivation layers 501, 502, and 503 cover (e.g., completely or entirely cover) the first to third opposite electrodes 401, 402, and 403, respectively, to protect the first to third opposite electrodes 401, 402, and 403 and the first to third intermediate layers 301, 302, and 303 from being damaged during the lift-off process, which may include a wet process.

In addition, the recessed portion SP (e.g., refer to FIG. 5) may be formed at (e.g., in or on) the pixel-defining layer 110 by forming the pixel-defining layer 110 to have a structure in which the step or step-type height difference SC1 is formed. Thus, a margin in the dry-etching process may be secured or ensured.

Hereinafter, referring to FIGS. 14 and 15, an organic light-emitting display apparatus 2 according to another embodiment is described.

Figure 14:
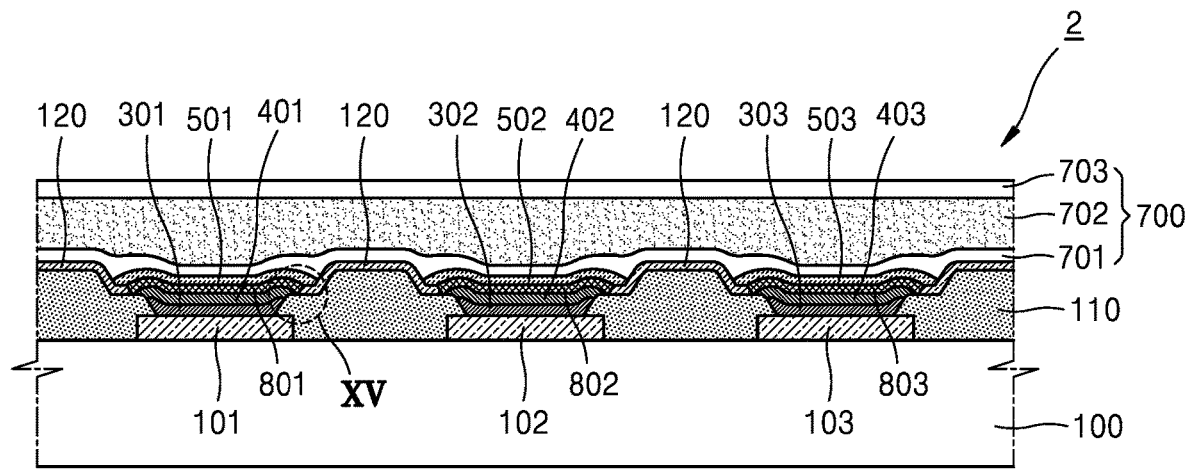
FIG. 14 is a schematic cross-sectional view of an organic light-emitting display apparatus according to another embodiment.

FIG. 14 is a schematic cross-sectional view of the organic light-emitting display apparatus 2 according to another embodiment. FIG. 15 is an enlarged cross-sectional view illustrating the region XV of the organic light-emitting display apparatus 2 of FIG. 14.

Figure 15:
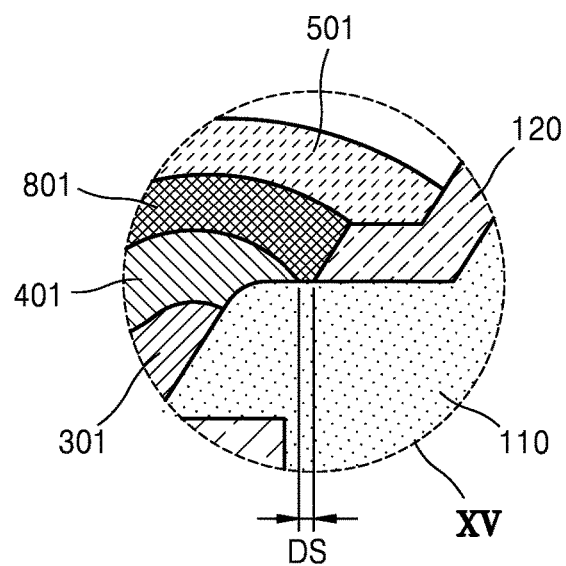
FIG. 15 is an enlarged cross-sectional view illustrating the region XV of the organic light-emitting display apparatus of FIG. 14.

Referring to FIGS. 14 and 15, in the organic light-emitting display apparatus 2 according to another embodiment, a plurality of pixel electrodes including the first pixel electrode 101, the second pixel electrode 102, and the third pixel electrode 103 are arranged on the substrate 100 to be spaced apart from each other. The pixel-defining layer 110 covers ends of the first to third pixel electrodes 101, 102, and 103, to prevent or substantially prevent concentration of an electric field on each of the ends of the plurality of first to third pixel electrodes 101, 102, and 103, and define a light-emitting area.

The auxiliary electrode 120 is arranged on the pixel-defining layer 110 to be spaced apart from the first to third pixel electrodes 101, 102, and 103. The auxiliary electrode 120 may be formed to surround (e.g., a periphery of) each of the first to third pixel electrodes 101, 102, and 103, and may have a closed loop shape.

Unlike the display apparatus 1 described above with reference to FIG. 1, in the present embodiment, parts (e.g., ends) of the first to third opposite electrodes 401, 402, and 403 may not be in contact with an upper surface of the auxiliary electrode 120. In other words, when the first to third opposite electrodes 401, 402, and 403 are deposited, ends of the first to third opposite electrodes 401, 402, and 403 may not overlap with ends of the auxiliary electrode 120, and thus, a separation distance DS between corresponding ends of the first to third opposite electrodes 401, 402, and 403 and corresponding ends of the auxiliary electrode 120 may be formed.

When parts (e.g., ends) of the first to third opposite electrodes 401, 402, and 403 are not in contact with the upper surface of the auxiliary electrode 120, a common power voltage that is connected to the auxiliary electrode 120 may not be applied to the first to third opposite electrodes 401, 402, and 403.

According to the present embodiment, a first connection layer 801, a second connection layer 802, and a third connection layer 803 may be further included to apply the common power voltage from the auxiliary electrode 120 to the first to third opposite electrodes 401, 402, and 403. For example, the first connection layer 801 may be arranged between the first opposite electrode 401 and the first passivation layer 501, the second connection layer 802 may be arranged between the second opposite electrode 402 and the second passivation layer 502, and the third connection layer 803 may be arranged between the third opposite electrode 403 and the third passivation layer 503. The first to third connection layers 803 may electrically connect the first to third opposite electrodes 401, 402, and 403 to the auxiliary electrode 120, respectively.

The first to third connection layers 801, 802, and 803 include a conductive material. For example, in an embodiment, the first to third connection layers 801, 802, and 803 may include a transparent conductive oxide.

Accordingly, when a driving current is transmitted from a driving thin-film transistor to each of the first to third pixel electrodes 101, 102, and 103, and the common power voltage is applied to the first to third opposite electrodes 401, 402, and 402 via the auxiliary electrode 120 and the first to third connection layers 801, 802, and 803, respectively, the first to third light-emitting layers of the first to third intermediate layers 301, 302, and 303 emit light.

The first to third passivation layers 501, 502, and 503 are arranged on the first to third connection layers 801, 802, and 803.

The first passivation layer 501 covers (e.g., completely or entirely covers) the first connection layer 801, and extends to the auxiliary electrode 120. Thus, an end of the first passivation layer 501 is in contact with an upper surface of the auxiliary electrode 120. The second passivation layer 502 covers (e.g., completely or entirely covers) the second connection layer 802, and extends to the auxiliary electrode 120. Thus, an end of the second passivation layer 502 is in contact with an upper surface of the auxiliary electrode 120. The third passivation layer 503 covers (e.g., completely or entirely covers) the third connection layer 803, and extends to the auxiliary electrode 120. Thus, an end of the third passivation layer 503 is in contact with an upper surface of the auxiliary electrode 120.

The first to third passivation layers 501, 502, and 503 cover (e.g., completely or entirely cover) the first to third intermediate layers 301, 302, and 303 and the first to third connection layers 801, 802, and 803, respectively, to prevent or reduce damage to an organic light-emitting diode during a patterning process.

Similar to the display apparatus 1 described with reference to FIG. 1, in the present embodiment, the first to third pixel electrodes 101, 102, and 103 may each have an island shape, and may be arranged to be spaced apart from each other. In addition, the first to third intermediate layers 301, 302, and 303 may be arranged on the first to third pixel electrodes 101, 102, and 103, respectively, and may each have an island shape. Further, similar to the display apparatus 1 described with reference to FIG. 1, each of the first to third opposite electrodes 401, 402, and 403, the first to third connection layers 801, 802, and 803, and the first to third passivation layers 501, 502, and 503 may be arranged to have an island shape.

The encapsulation member 700 is arranged to cover the upper surfaces of each of the first to third passivation layers 501, 502, and 503, and an upper surface of the auxiliary electrode 120.

The encapsulation member 700 may include at least one organic layer and at least one inorganic layer. For example, FIG. 14 shows a structure in which the encapsulation member 700 includes the first inorganic layer 701, the organic layer 702, and the second inorganic layer 703 that are sequentially stacked, but the present disclosure is not limited thereto.

As described above, in the organic light-emitting display apparatus 2 and a method of manufacturing the same according to the present embodiment, because a passivation layer is formed by using a deposition method that provides a large step coverage, an opposite electrode is covered (e.g., completely or entirely covered) to protect an intermediate layer and an opposite electrode during a lift-off process. In addition, dry-etching is performed in the same chamber to prevent or reduce damage that may be caused by an atmosphere and moisture outside the chamber, and an auxiliary electrode may be formed to prevent or substantially prevent a voltage drop in a common electrode.

In addition, in some embodiments, by forming a conductive connection layer between the opposite electrode and a passivation layer, even when the opposite electrode is spaced apart from the auxiliary electrode, the conductive connection layer electrically connects the opposite electrode to the auxiliary electrode to prevent or substantially prevent a power failure. In addition, by forming a pixel-defining layer to have a structure including a step or step-type height difference, a recessed space is formed at (e.g., in or on) the pixel-defining layer. Thus, a margin in a dry-etching process may be secured or ensured.

According to one or more embodiments of the present disclosure, because an intermediate layer including a light-emitting layer is formed by using a lift-off process instead of depositing the intermediate layer by using a fine metal mask, a misalignment problem of the fine metal mask may be prevented or substantially prevented, and the manufacturing costs may be reduced.

According to one or more embodiments of the present disclosure, by forming the passivation layer by using a vapor deposition method that provides a suitable step coverage (e.g., an excellent step coverage), the opposite electrode may be covered (e.g., completely or entirely covered) to reduce failures in an light-emitting diode.

According to one or more embodiments of the present disclosure, even when an end of a photoresist is overhung, and thus, an undercut space is reduced, a recessed space may be formed at (e.g., in or on) the pixel-defining layer as the pixel-defining layer includes a step or step-type height difference. Thus, a subsequent process may be smoothly performed.

However, the present disclosure is not limited to the above-described effects, features, and/or aspects.

While example embodiments of the present disclosure have been described with reference to the figures, it should be understood that the embodiments described herein should be considered in a descriptive sense only and not for purposes of limitation. Descriptions of features or aspects within each embodiment should typically be considered as available for other similar features or aspects in other embodiments. Therefore, it will be understood by those of ordinary skill in the art that various modifications in form and/or details may be made therein without departing from the spirit and scope of the present disclosure as defined by the following claims, and their equivalents.

What is claimed is:

1. An organic light-emitting display apparatus comprising:
   a substrate;
   first and second pixel electrodes on the substrate and spaced from each other;
   an insulating layer between the first and second pixel electrodes, the insulating layer covering ends of the first and second pixel electrodes and having a step height difference;
   an auxiliary electrode on the insulating layer;
   first and second intermediate layers on the first and second pixel electrodes, respectively, the first and second intermediate layers being spaced from each other, and comprising first and second light-emitting layers, respectively;

first and second opposite electrodes on the first and second intermediate layers, respectively, the first and second opposite electrodes being spaced from each other, and in contact with the auxiliary electrode; and first and second passivation layers on the first and second opposite electrodes, respectively, the first and second passivation layers being spaced from each other, and covering the first and second opposite electrodes, respectively, while contacting the auxiliary electrode and exposing a top surface of the auxiliary electrode between the first and second opposite electrodes.

2. The organic light-emitting display apparatus of claim 1, wherein the auxiliary electrode has a closed loop shape that surrounds peripheries of the first and second pixel electrodes.

3. The organic light-emitting display apparatus of claim 1, wherein the insulating layer has a closed loop shape that surrounds peripheries of the first and second pixel electrodes.

4. The organic light-emitting display apparatus of claim 1, wherein the insulating layer comprises:
   a first layer comprising an organic insulating material; and
   a second layer covering the first layer, the second layer comprising an inorganic insulating material.

5. The organic light-emitting display apparatus of claim 1, wherein the insulating layer comprises:
   a first layer comprising an inorganic insulating material;
   a second layer on the first layer, the second layer comprising an organic insulating material; and
   a third layer on the second layer, the third layer comprising an inorganic insulating layer.

6. The organic light-emitting display apparatus of claim 1, wherein ends of the first and second opposite electrodes are in contact with an upper surface of the auxiliary electrode.

7. The organic light-emitting display apparatus of claim 1, wherein each of the first and second passivation layers comprises at least one selected from among an oxide, a nitride, and an oxynitride.

8. The organic light-emitting display apparatus of claim 1, further comprising:
   an encapsulation member sequentially arranged on the first passivation layer and the second passivation layer, the encapsulation member comprising at least one organic layer and at least one inorganic layer.

9. The organic light-emitting display apparatus of claim 1, further comprising:
   a first connection layer between the first opposite electrode and the first passivation layer; and
   a second connection layer between the second opposite electrode and the second passivation layer.

10. The organic light-emitting display apparatus of claim 9, wherein each of the first and second connection layers comprises a transparent conductive oxide.

* * * * *